US012515452B2

(12) United States Patent
Nozawa et al.

(10) Patent No.: US 12,515,452 B2
(45) Date of Patent: Jan. 6, 2026

(54) DRIVE CIRCUIT AND LIQUID EJECTING APPARATUS

(71) Applicant: SEIKO EPSON CORPORATION, Tokyo (JP)

(72) Inventors: Dai Nozawa, Matsumoto (JP); Noritaka Ide, Shiojiri (JP); Kunio Tabata, Shiojiri (JP); Rika Tanimoto, Matsumoto (JP); Satoru Uematsu, Shiojiri (JP)

(73) Assignee: SEIKO EPSON CORPORATION (JP)

( * ) Notice: Subject to any disclaimer, the term of this patent is extended or adjusted under 35 U.S.C. 154(b) by 154 days.

(21) Appl. No.: 18/611,884

(22) Filed: Mar. 21, 2024

(65) Prior Publication Data

US 2024/0316917 A1 Sep. 26, 2024

(30) Foreign Application Priority Data

Mar. 22, 2023 (JP) ................. 2023-045449

(51) Int. Cl.
*B41J 2/045* (2006.01)
(52) U.S. Cl.
CPC ......... *B41J 2/04541* (2013.01); *B41J 2/0455* (2013.01); *B41J 2/04581* (2013.01); *B41J 2/04588* (2013.01)
(58) Field of Classification Search
None
See application file for complete search history.

(56) References Cited

U.S. PATENT DOCUMENTS 11,993,080 B2 * 5/2024 Kawaguchi ............ B41J 2/0458
2022/0097364 A1 3/2022 Ide et al.

FOREIGN PATENT DOCUMENTS

JP 2010114500 A * 5/2010
JP 2022-057167 A 4/2022

OTHER PUBLICATIONS

Ide, Machine Translation of JP-2010114500-A, 2010 (Year: 2010).*

* cited by examiner

*Primary Examiner* — Scott A Richmond
(74) *Attorney, Agent, or Firm* — Harness, Dickey & Pierce, P.L.C.

(57) ABSTRACT

A drive circuit includes a modulation circuit that modulates a base drive signal, and outputs a modulation signal, an amplification circuit that outputs a first amplified modulation signal obtained by amplifying the modulation signal, a level switching signal generation circuit that generates a level switching signal, a level shift circuit that outputs the first amplified modulation signal as a second amplified modulation signal when the level switching signal has the first potential, and outputs, as the second amplified modulation signal, a signal obtained by shifting a potential of the first amplified modulation signal when the level switching signal has the second potential, and a demodulation circuit that demodulates the second amplified modulation signal. A threshold when the level switching signal generation circuit switches from the first potential to the second potential is different from a threshold when switching from the second potential to the first potential.

6 Claims, 20 Drawing Sheets

FIG. 14
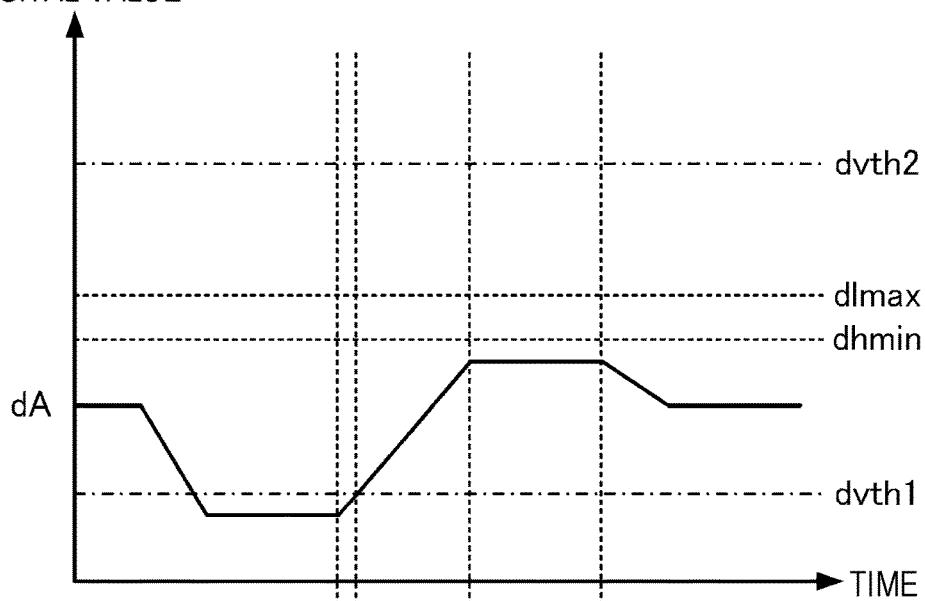
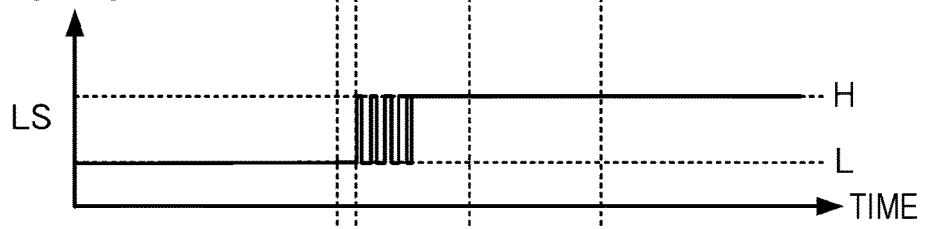
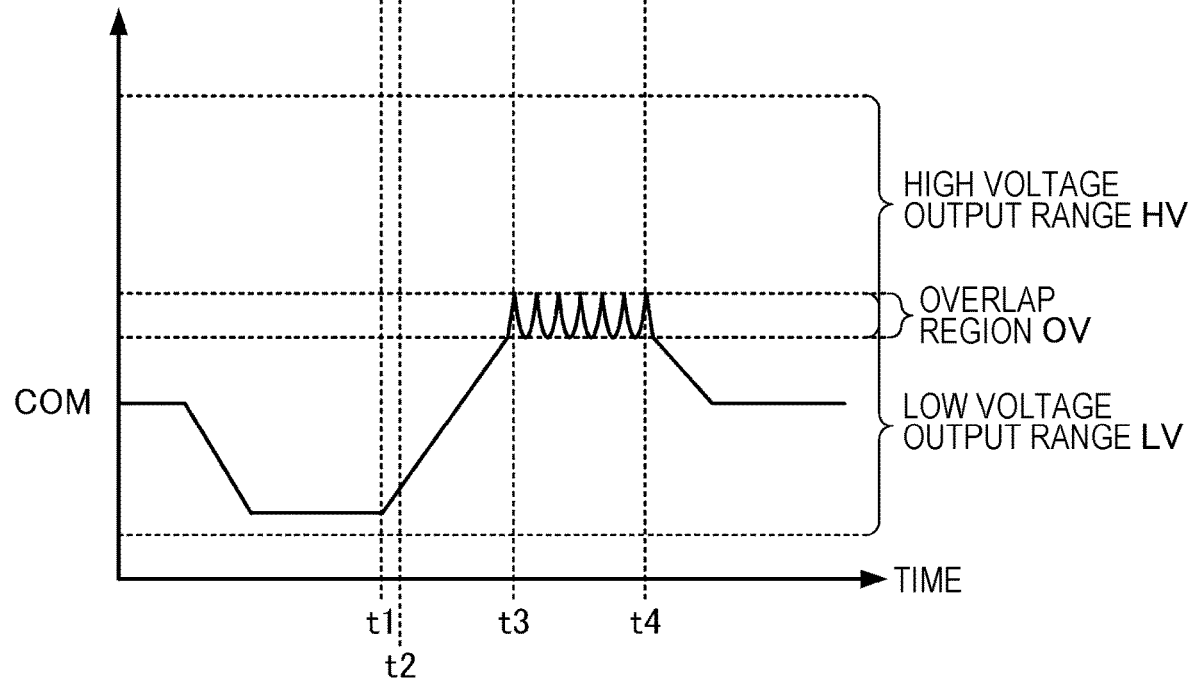

FIG. 15
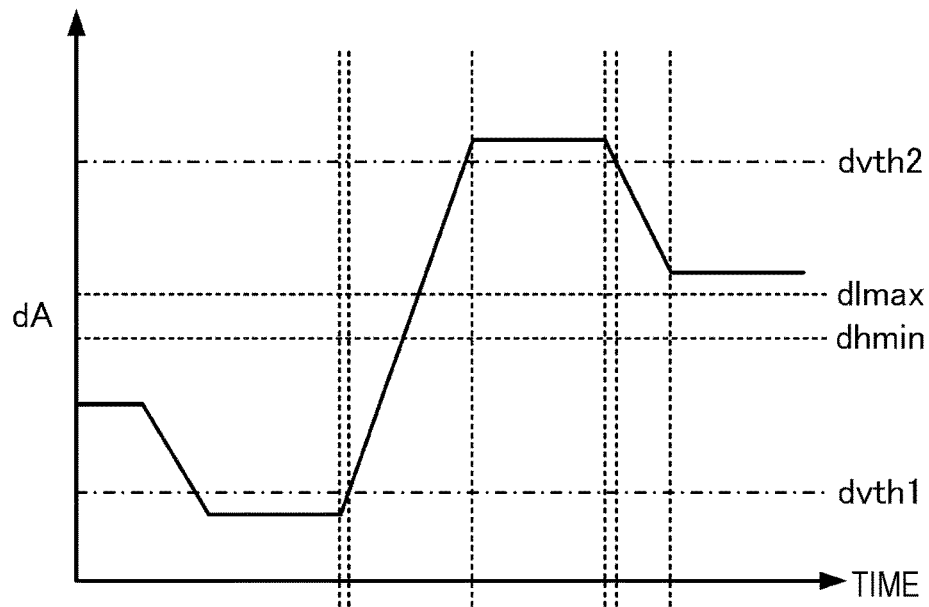
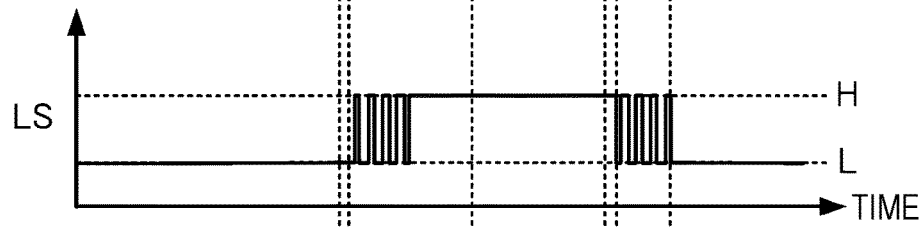
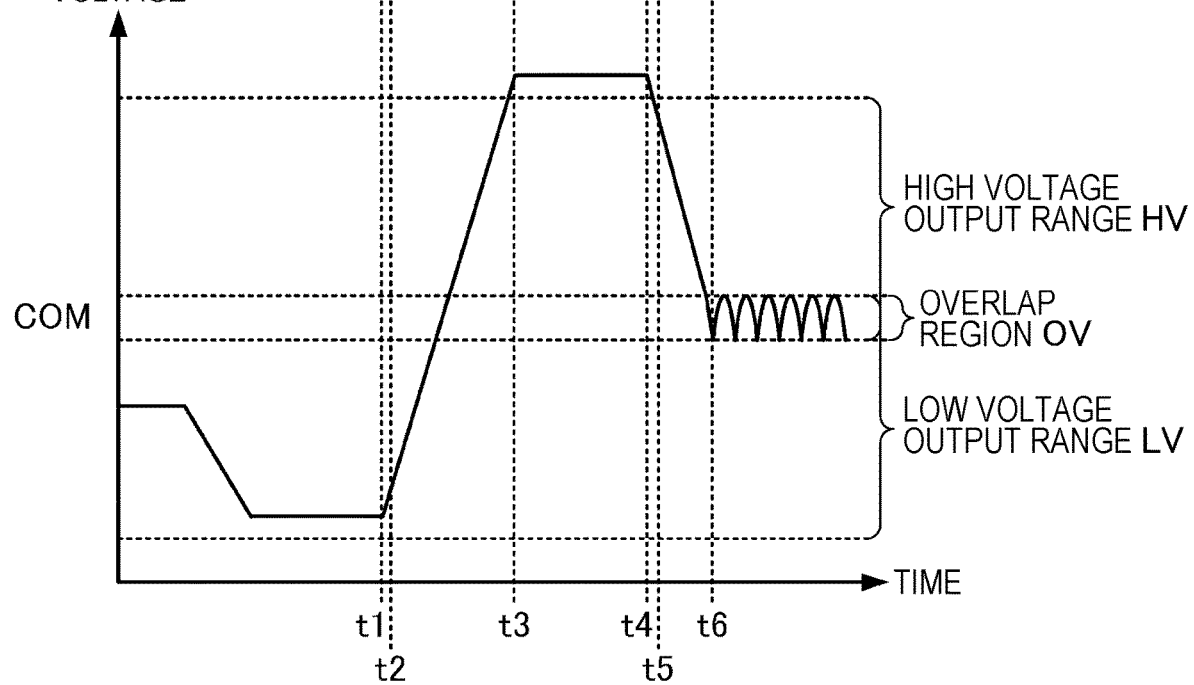

FIG. 16
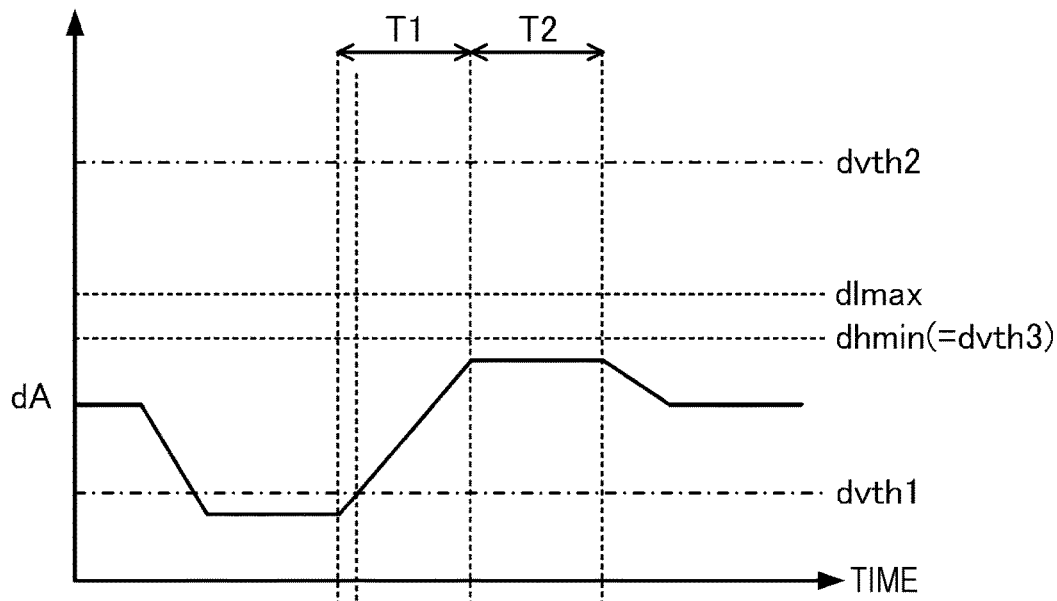
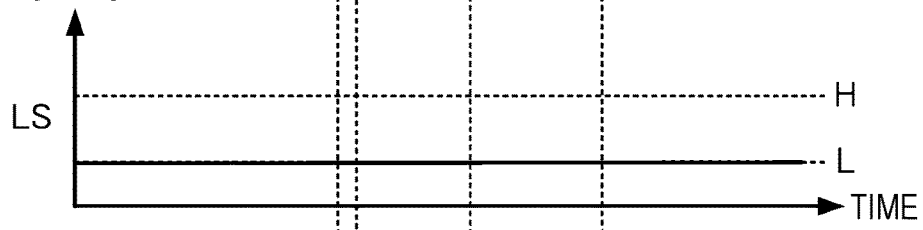
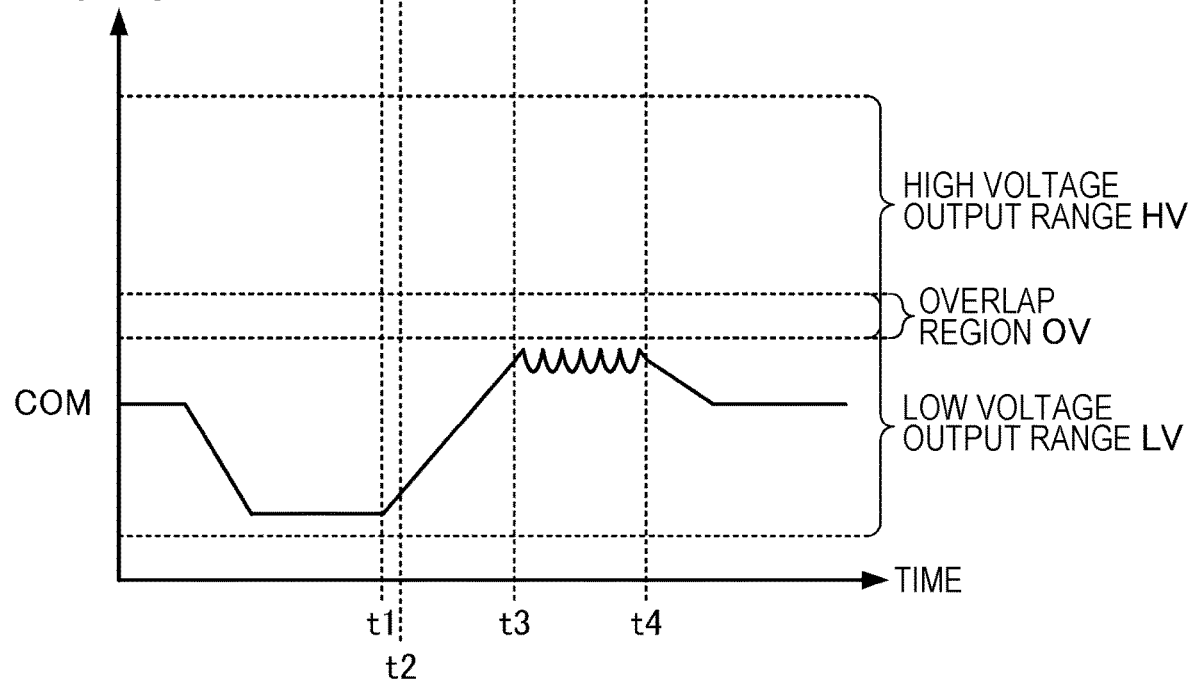

FIG. 17
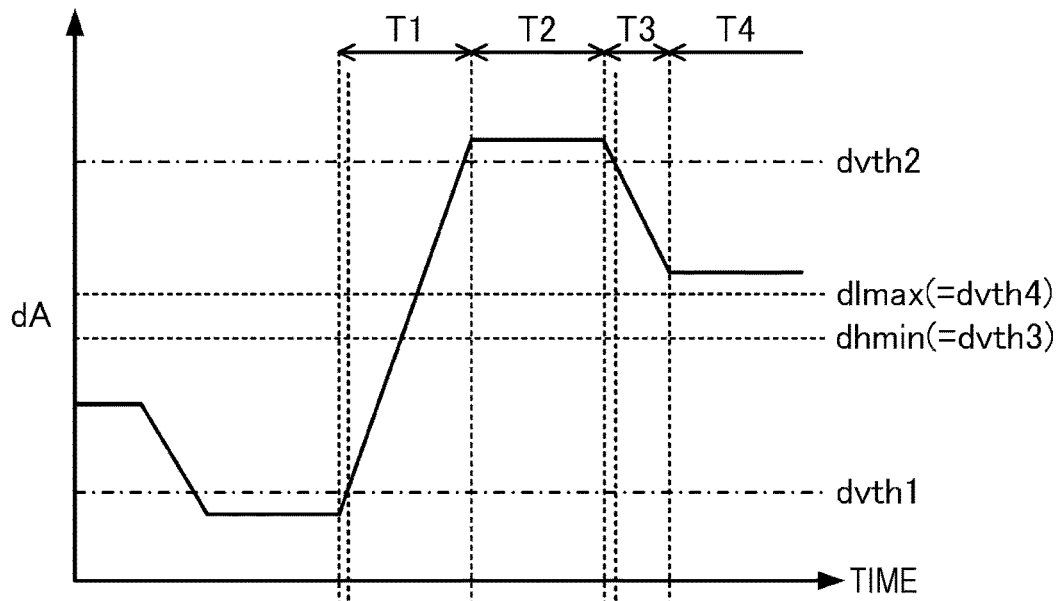
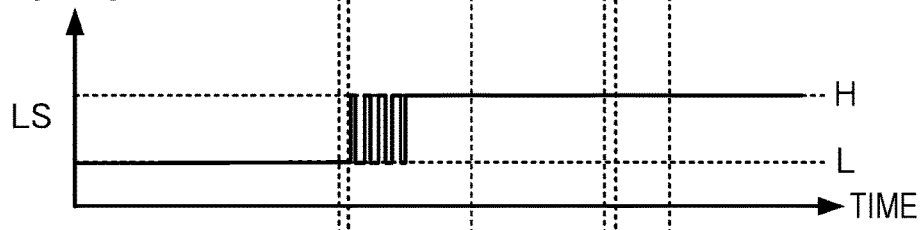
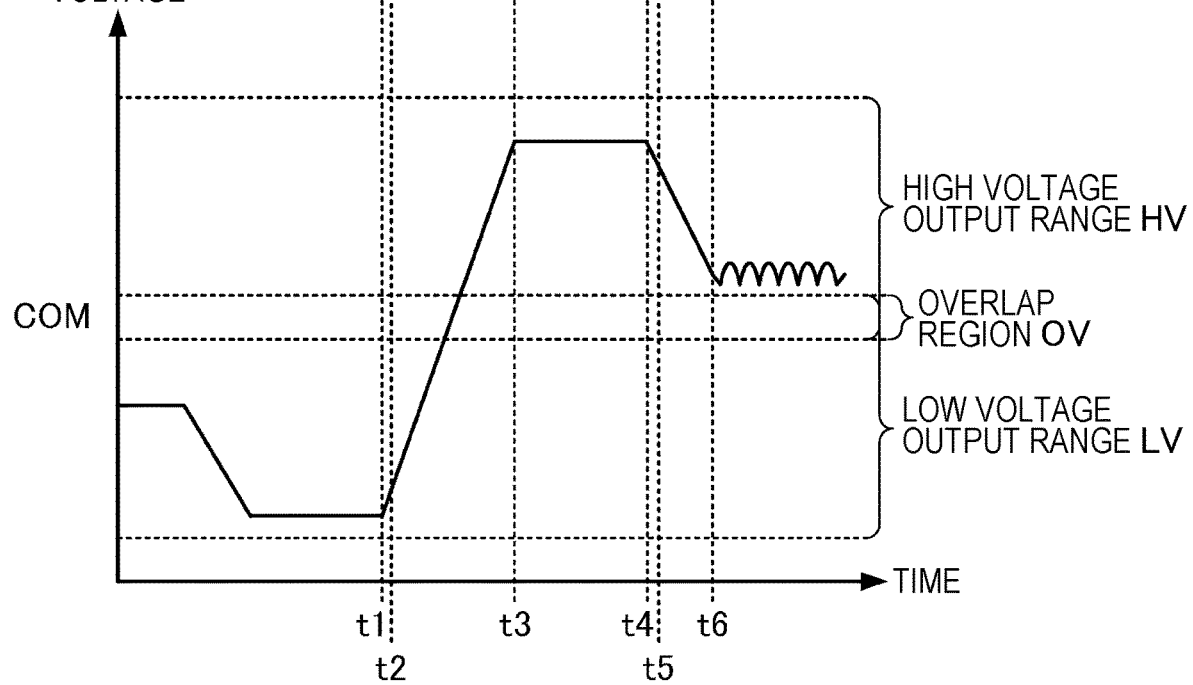

DRIVE CIRCUIT AND LIQUID EJECTING APPARATUS

The present application is based on, and claims priority from JP Application Serial Number 2023-045449, filed Mar. 22, 2023, the disclosure of which is hereby incorporated by reference herein in its entirety.

BACKGROUND

1. Technical Field

The present disclosure relates to a drive circuit and a liquid ejecting apparatus.

2. Related Art

As a liquid ejecting apparatus that ejects a liquid to form an image or a document on a medium, a device using piezoelectric elements is known. In such a liquid ejecting apparatus, the piezoelectric elements are provided to correspond to a plurality of nozzles that eject the liquid, and is driven according to a drive signal. The piezoelectric element is driven, and the liquid is ejected from the nozzle provided to correspond to the piezoelectric element. It is necessary to supply a sufficient current in order to operate such a piezoelectric element. Thus, a drive circuit that outputs a drive signal for driving the piezoelectric element includes an amplification circuit that amplifies a source signal that is a base of the drive signal by an amplification circuit.

JP-A-2022-057167 discloses a drive circuit that can efficiently amplify a signal by including a pulse modulation circuit that modulates a base drive signal that is a base of a drive signal and outputs a modulation signal, an amplification circuit that outputs an amplified modulation signal obtained by amplifying the modulation signal from a first output point, a level shift circuit that outputs a level shift amplified modulation signal obtained by shifting a potential of the amplified modulation signal from a second output point, and a demodulation circuit that demodulates the level shift amplified modulation signal, and outputs a drive signal.

However, from the viewpoint of waveform accuracy of the drive signal or a loss of a switching element, a technology described in JP-A-2022-057167 is not sufficient, and there is room for improvement.

SUMMARY

According to an aspect of the present disclosure, there is provided a drive circuit that outputs a drive signal for driving a drive section. The drive circuit includes a modulation circuit that modulates a base drive signal that is a base of the drive signal, and outputs a modulation signal, an amplification circuit that outputs a first amplified modulation signal obtained by amplifying the modulation signal, a level switching signal generation circuit that generates a level switching signal that is a digital signal including a first potential and a second potential higher than the first potential, a level shift circuit that outputs the first amplified modulation signal as a second amplified modulation signal when the level switching signal has the first potential, and outputs, as the second amplified modulation signal, a signal obtained by shifting a potential of the first amplified modulation signal when the level switching signal has the second potential, a demodulation circuit that demodulates the second amplified modulation signal, and outputs the drive signal, and a storage that stores a first threshold and a second threshold different from the first threshold. The level switching signal generation circuit switches the level switching signal from the first potential to the second potential in a case where a value of the base drive signal increases and becomes larger than the first threshold when the level switching signal has the first potential, and switches the level switching signal from the second potential to the first potential in a case where the value of the base drive signal decreases and becomes smaller than the second threshold when the level switching signal has the second potential.

According to another aspect of the present disclosure, there is provided a liquid ejecting apparatus including an ejecting section that ejects a liquid, and a drive circuit that outputs a drive signal for driving the ejecting section. The drive circuit includes a modulation circuit that modulates a base drive signal that is a base of the drive signal, and outputs a modulation signal, an amplification circuit that outputs a first amplified modulation signal obtained by amplifying the modulation signal, a level switching signal generation circuit that generates a level switching signal that is a digital signal including a first potential and a second potential higher than the first potential, a level shift circuit that outputs the first amplified modulation signal as a second amplified modulation signal when the level switching signal has the first potential, and outputs, as the second amplified modulation signal, a signal obtained by shifting a potential of the first amplified modulation signal when the level switching signal has the second potential, a demodulation circuit that demodulates the second amplified modulation signal, and outputs the drive signal, and a storage that stores a first threshold and a second threshold different from the first threshold, and the level switching signal generation circuit switches the level switching signal from the first potential to the second potential in a case where a value of the base drive signal increases and becomes larger than the first threshold when the level switching signal has the first potential, and switches the level switching signal from the second potential to the first potential in a case where the value of the base drive signal decreases and becomes smaller than the second threshold when the level switching signal has the second potential.

BRIEF DESCRIPTION OF THE DRAWINGS

FIG. 14 is a diagram illustrating an example in which the waveform of the drive signal deteriorates.

FIG. 15 is a diagram illustrating another example in which the waveform of the drive signal deteriorates.

FIG. 16 is a diagram illustrating an example of waveforms of a base drive signal, a level switching signal, and a drive signal according to a second embodiment.

FIG. 17 is a diagram illustrating another example of the waveforms of the base drive signal, the level switching signal, and the drive signal according to the second embodiment.

DESCRIPTION OF EMBODIMENTS

Hereinafter, appropriate embodiments of the present disclosure will be described with reference to the drawings. The drawings to be used are for the sake of convenience in description. In addition, embodiments to be described below do not inappropriately limit the contents of the present disclosure described in the claims. Moreover, not all of configurations to be described below are necessarily essential components of the present disclosure.

In the following description, an ink jet printer for a consumer is used as an example of a liquid ejecting apparatus according to the present disclosure. However, the liquid ejecting apparatus is not limited to an ink jet printer, and may be, for example, a coloring material ejecting apparatus used for manufacturing a color filter such as a liquid crystal display, an electrode material ejecting apparatus used for forming an electrode such as an organic EL display and a surface emission display, and a bioorganic substance ejecting apparatus used for manufacturing a biochip.

1. First Embodiment 1-1. Overview of Liquid Ejecting Apparatus

Figure 1:
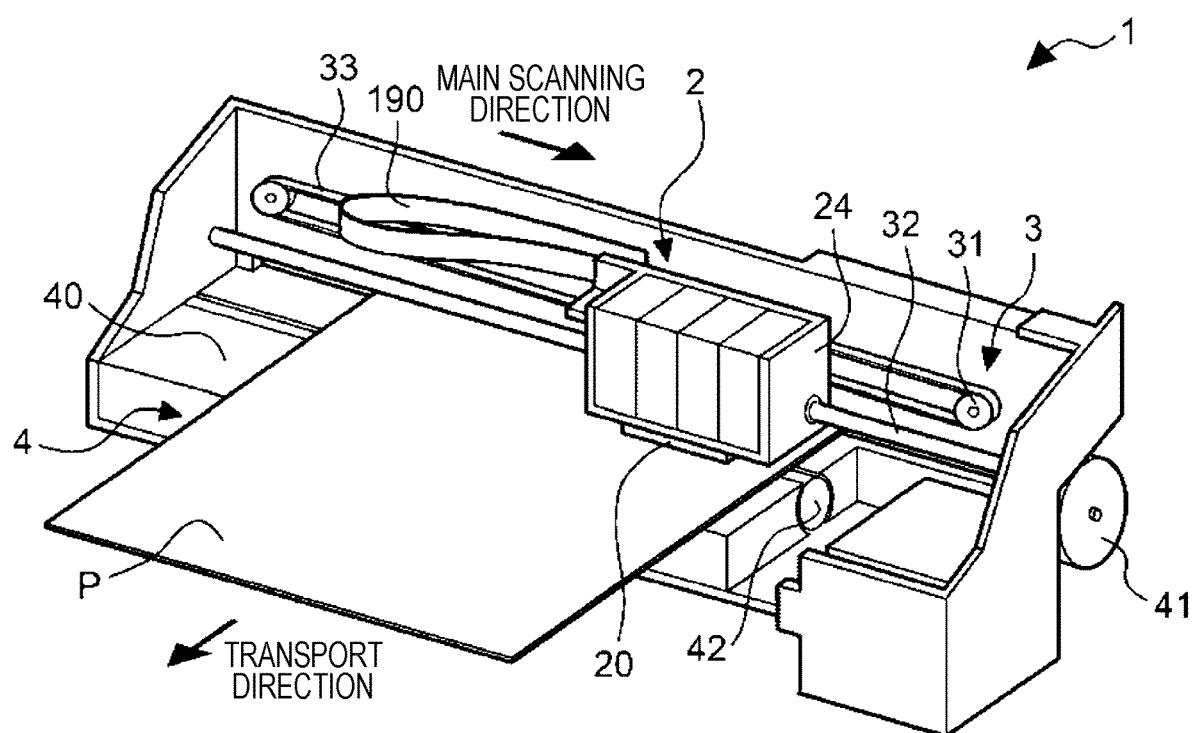
FIG. 1 is a diagram illustrating an example of a structure of a liquid ejecting apparatus.

FIG. 1 is a diagram illustrating an example of a structure of a liquid ejecting apparatus 1. As illustrated in FIG. 1, the liquid ejecting apparatus 1 includes a moving object 2 and a moving unit 3 that causes the moving object 2 to reciprocate along a main scanning direction.

The moving unit 3 includes a carriage motor 31 that is a drive source for the reciprocating of the moving object 2 along the main scanning direction, a carriage guide shaft 32 that has fixed both ends, and a timing belt 33 that extends substantially parallel to the carriage guide shaft 32 and is driven by the carriage motor 31.

The moving object 2 includes a carriage 24. The carriage 24 is supported by the carriage guide shaft 32 to be able to reciprocate and is fixed to a part of the timing belt 33. The timing belt 33 travels forward and rearward by the carriage motor 31, and thus, the moving object 2 having the carriage 24 is guided by the carriage guide shaft 32 to reciprocate. Moreover, a head unit 20 is positioned in a portion of the moving object 2 facing a medium P. That is, the head unit 20 is mounted on the carriage 24. Multiple nozzles that eject ink as a liquid are positioned on a surface of the head unit 20 facing the medium P. Moreover, various control signals for controlling an operation of the head unit 20 are supplied to the head unit 20 via a cable 190. A flexible flat cable or the like that can slide to follow the reciprocating of the moving object 2 can be used as such a cable 190.

Moreover, the liquid ejecting apparatus 1 includes a transport unit 4 for transporting the medium P on a platen 40 along a transport direction. The transport unit 4 includes a transport motor 41 that is a drive source for transporting the medium P, and a transport roller 42 that transports the medium P along the transport direction by being rotated with a drive force of the transport motor 41.

In the liquid ejecting apparatus 1 having the above-described configuration, the head unit 20 ejects the ink on the medium P in synchronization with a timing at which the medium P is transported by the transport unit 4. Consequently, the ink ejected by the head unit 20 lands at a desired position on the medium P, and a desired image or character is formed at the surface of the medium P.

Figure 2:
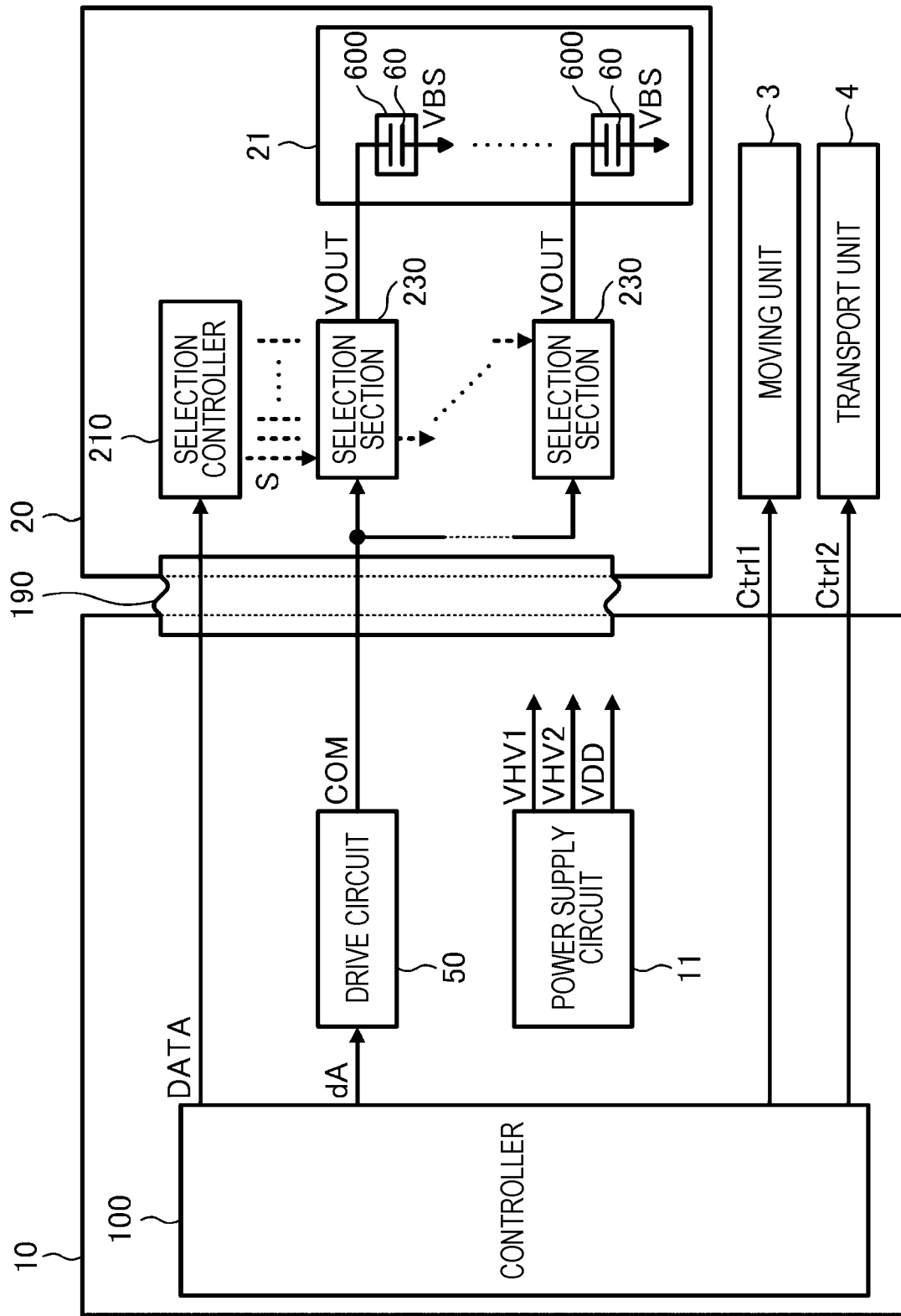
FIG. 2 is a diagram illustrating a functional configuration of the liquid ejecting apparatus.

Next, a functional configuration of the liquid ejecting apparatus 1 will be described. FIG. 2 is a diagram illustrating the functional configuration of the liquid ejecting apparatus 1. As illustrated in FIG. 2, the liquid ejecting apparatus 1 includes a control unit 10, the head unit 20, the moving unit 3, the transport unit 4, and the cable 190. The cable 190 electrically couples the control unit 10 and the head unit 20.

The control unit 10 includes a power supply circuit 11, a controller 100, and a drive circuit 50.

The power supply circuit 11 generates voltage signals VHV1, VHV2, and VDD having predetermined voltage values from a commercial AC power supply supplied from an outside of the liquid ejecting apparatus 1, and outputs the voltage signals VHV1, VHV2, and VDD to the sections of the liquid ejecting apparatus 1. Here, the voltage signals VHV1 and VHV2 output by the power supply circuit 11 are, for example, a DC voltage of 21 V, and the voltage signal VDD is, for example, a DC voltage of 3.3 V. Such a power supply circuit 11 may include, for example, an AC/DC converter that generates a DC voltage having a predetermined voltage value from a commercial AC power supply, and a DC/DC converter that converts the voltage threshold value of the generated DC voltage to generate the voltage signals VHV1, VHV2, and VDD. In addition, the power supply circuit 11 may output DC voltages having different voltage values in addition to the voltage signals VHV1, VHV2, and VDD. Here, in the following description, the voltage of the voltage signal VHV1 may be referred to as a voltage vhv1, the voltage of the voltage signal VHV2 may be referred to as a voltage vhv2, and the voltage of the voltage signal VDD may be referred to as a voltage vdd.

Image data is supplied to the controller 100 from an external device (not illustrated) provided outside the liquid ejecting apparatus 1, for example, from a host computer or the like. The controller 100 generates various control signals for controlling the sections of the liquid ejecting apparatus 1 by performing various kinds of image processing and the like on the supplied image data, and outputs the various control signals to the corresponding sections.

Specifically, the controller 100 generates a control signal Ctrl1 for controlling the reciprocating of the moving object 2 based on the image data, and outputs the control signal Ctrl1 to the carriage motor 31 included in the moving unit 3. Moreover, the controller 100 generates a control signal Ctrl2 for controlling the transport of the medium P based on the image data, and outputs the control signal Ctrl2 to the transport motor 41 included in the transport unit 4. Consequently, the reciprocating of the moving object 2 along the main scanning direction and the transport of the medium P along the transport direction are controlled by the controller 100. That is, the head unit 20 can eject the ink on the medium P at a predetermined timing synchronized with the transport of the medium P. Consequently, the ink can be landed at a desired position on the medium P, and a desired image or character can be formed at the medium P.

In addition, the controller 100 may convert the control signal Ctrl1 for controlling the reciprocating of the moving object 2 by a carriage motor driver (not illustrated) and then supply the converted control signal to the moving unit 3. Similarly, the controller 100 may convert the control signal Ctrl2 for controlling the transport of the medium P by a transport motor driver (not illustrated) and then supply the converted control signal to the transport unit 4.

Moreover, the controller 100 outputs a base drive signal dA to the drive circuit 50. Here, the base drive signal dA is a digital signal including information that defines a signal waveform of a drive signal COM supplied to the head unit 20. The drive circuit 50 converts the base drive signal dA into an analog signal, and then amplifies the converted analog signal to generate the drive signal COM. The drive circuit 50 supplies the generated drive signal COM to the head unit 20. In addition, a configuration and an operation of the drive circuit 50 will be described below in detail.

Moreover, the controller 100 generates a drive data signal DATA for controlling the operation of the head unit 20, and outputs the drive data signal DATA to the head unit 20. The head unit 20 includes a selection controller 210, a plurality of selection sections 230, and a liquid ejecting head 21. Moreover, the liquid ejecting head 21 includes a plurality of ejecting sections 600 each including a piezoelectric element 60. Each of the plurality of selection sections 230 is provided to correspond to the piezoelectric element 60 included in each of a plurality of ejecting sections 600 included in the liquid ejecting head 21.

The drive data signal DATA is input to the selection controller 210. The selection controller 210 generates a selection signal S instructing each of the selection sections 230 whether to select or not select the drive signal COM based on the drive data signal DATA, and outputs the selection signal S to each of the plurality of selection sections 230. The drive signal COM and the corresponding selection signal S are input to each of the plurality of selection sections 230. Each of the plurality of selection sections 230 selects or does not select the drive signal COM based on the selection signal S to generate and output a drive signal VOUT. That is, each of the plurality of selection sections 230 generates the drive signal VOUT based on the drive signal COM, and supplies the drive signal VOUT to one end of the piezoelectric element 60 included in the corresponding ejecting section 600 included in the liquid ejecting head 21.

Moreover, a reference voltage signal VBS is commonly supplied to the other end of the piezoelectric element 60 included in the plurality of ejecting sections 600. The reference voltage signal VBS is a signal that functions as a reference potential for driving the piezoelectric element 60 driven by the drive signal VOUT, and is, for example, a signal having a constant potential such as 5.5 V, 6 V, or a ground potential (0 V).

The piezoelectric element 60 is provided to correspond to each of the plurality of nozzles in the head unit 20. The piezoelectric element 60 is driven in accordance with a potential difference between the drive signal VOUT supplied to one end and the reference voltage signal VBS supplied to the other end. As a result, an amount of ink corresponding to a driving amount of the piezoelectric element 60 is ejected from the ejecting section 600 including the piezoelectric element 60.

In addition, although FIG. 2 illustrates a case where the head unit 20 has one liquid ejecting head 21, the number of liquid ejecting heads 21 included in the head unit 20 is not limited to one, and the head unit 20 may have a plurality of liquid ejecting heads 21 in accordance with the type and number of inks to be ejected, or the like.

As described above, the liquid ejecting apparatus 1 according to the present embodiment includes the plurality of piezoelectric elements 60 that are driven by the drive signals COM and VOUT being supplied, the liquid ejecting head 21 that ejects the ink as an example of the liquid by the driving of the plurality of piezoelectric elements 60, and the drive circuit 50 that outputs the drive signal COM.

1-2. Configuration of Ejecting Section

Figure 3:
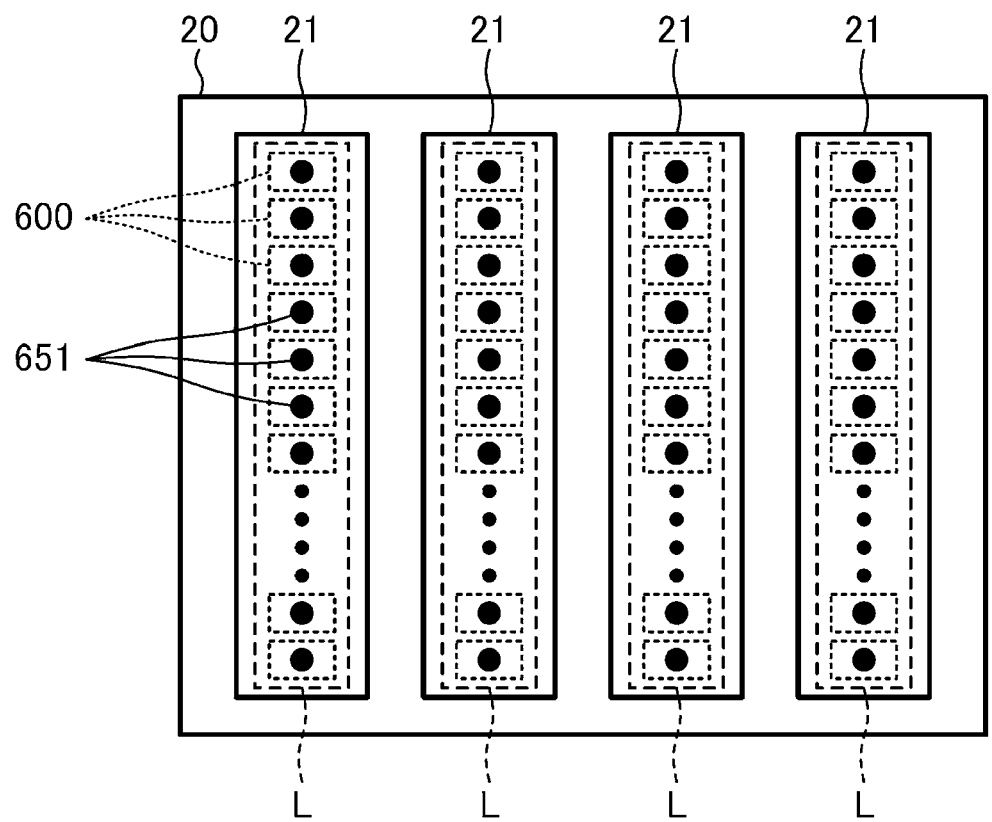
FIG. 3 is a diagram illustrating an example of disposition of a plurality of ejecting sections in a head unit.

Next, a configuration of the plurality of ejecting sections 600 included in the liquid ejecting head 21 and an example of the disposition of the plurality of ejecting sections 600 in the head unit 20 will be described. FIG. 3 is a diagram illustrating an example of the disposition of the plurality of ejecting sections 600 in the head unit 20. FIG. 3 illustrates a case where the head unit 20 includes four liquid ejecting heads 21.

As illustrated in FIG. 3, each of the four liquid ejecting heads 21 includes the plurality of ejecting sections 600 provided in a row in one direction. That is, the liquid ejecting head 21 includes a nozzle row L in which nozzles 651, to be described later, included in the ejecting section 600 are arranged in one direction. Moreover, the liquid ejecting heads 21 are positioned side by side in the head unit 20 in a direction intersecting the nozzle row L. That is, the head unit 20 is formed with the same number of nozzle rows L as the number of liquid ejecting heads 21. In addition, the disposition of the nozzles 651 in the nozzle row L is not limited to one row, and for example, even-numbered nozzles 651 counted from one end portion of the plurality of nozzles 651 and odd-numbered nozzles 651 counted from one end portion of the plurality of nozzles 651 may be disposed in a staggered manner such that positions of the even-numbered nozzles 651 and the odd-numbered nozzles 651 are different, and one nozzle row L may be formed by providing the plurality of nozzles 651 side by side in two or more rows.

Figure 4:
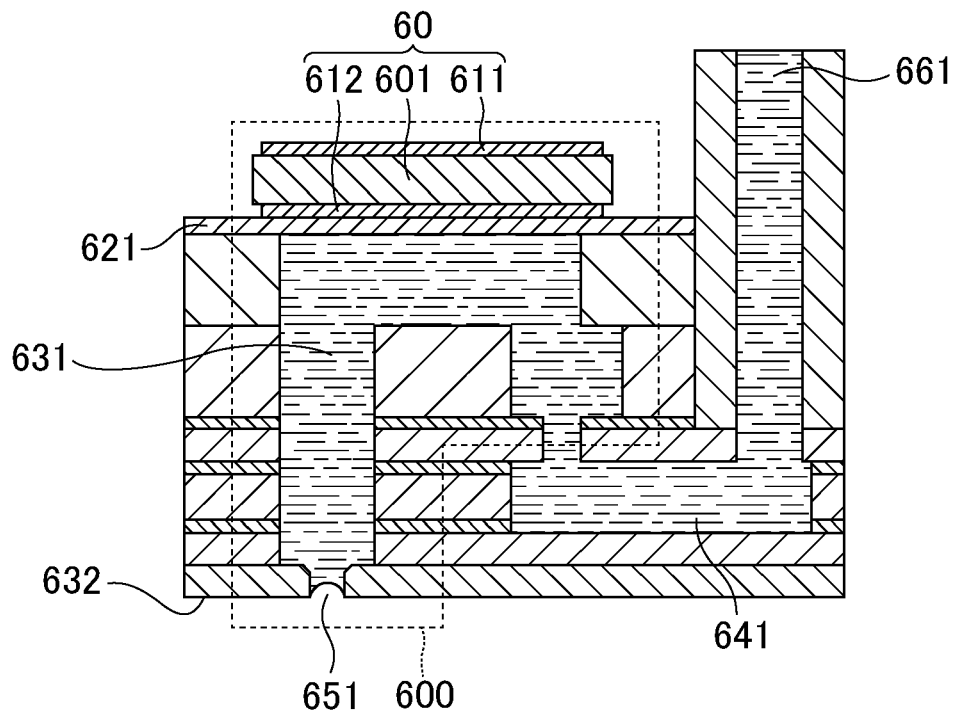
FIG. 4 is a diagram illustrating an example of a configuration of the ejecting section.

Next, an example of a configuration of the ejecting section 600 will be described. FIG. 4 is a diagram illustrating an example of the configuration of the ejecting section 600. As illustrated in FIG. 4, the ejecting section 600 includes the piezoelectric element 60, a vibrating plate 621, a cavity 631, and the nozzle 651. The vibrating plate 621 is displaced as the piezoelectric element 60 provided on an upper surface in FIG. 4 is driven. The vibrating plate 621 functions as a diaphragm that expands/contracts an internal volume of the cavity 631. The inside of the cavity 631 is filled with ink. The cavity 631 functions as a pressure chamber in which an internal volume changes due to the displacement of the vibrating plate 621 caused by the driving of the piezoelectric element 60. The nozzle 651 is an opening portion formed in the nozzle plate 632 and communicating with the cavity 631. As the internal volume of the cavity 631 changes, the ink stored inside the cavity 631 is ejected from the nozzle 651.

The piezoelectric element 60 has a structure in which a piezoelectric body 601 is interposed between a pair of electrodes 611 and 612. In the piezoelectric body 601 having this structure, central portions of the electrodes 611 and 612 and the vibrating plate 621 are bent in an up-down direction in FIG. 4 with respect to both end portions in accordance with a potential difference between the electrodes 611 and 612.

Specifically, the drive signal VOUT is supplied to the electrode 611 which is one end of the piezoelectric element 60, and the reference voltage signal VBS is supplied to the electrode 612 which is the other end. When the piezoelectric element 60 is driven in an up direction in accordance with a change in the voltage of the drive signal VOUT, the vibrating plate 621 is displaced in the up direction. As a result, the internal volume of the cavity 631 is expanded. Accordingly, the ink stored in a reservoir 641 is drawn into the cavity 631. On the other hand, when the piezoelectric element 60 is driven in a down direction in accordance with a change in the voltage of the drive signal VOUT, the vibrating plate 621 is displaced in a down direction. As a result, the internal volume of the cavity 631 is contracted. Accordingly, an amount of ink corresponding to a degree of contraction in the internal volume of the cavity 631 is ejected from the nozzle 651.

As described above, the liquid ejecting head 21 includes the piezoelectric element 60, and ejects the ink on the medium P by driving the piezoelectric element 60. In addition, the ejecting section 600 and the piezoelectric element 60 included in the ejecting section 600 are not limited to the illustrated configuration, and may have a structure in which the piezoelectric element 60 is driven based on the drive signal VOUT and the ink can be ejected from the corresponding nozzle 651 by the driving of the piezoelectric element 60.

1-3. Configuration and Operation of Drive Circuit

Next, a configuration and an operation of the drive circuit 50 will be described.

1-3-1. Signal Waveform of Drive Signal COM

Figure 5:
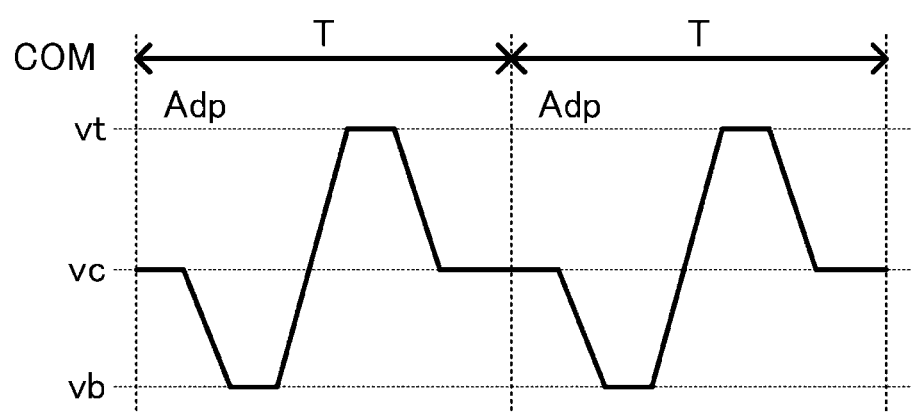
FIG. 5 is a diagram illustrating an example of a signal waveform of a drive signal.

In describing the configuration and the operation of the drive circuit 50, first, an example of the signal waveform of the drive signal COM output by the drive circuit 50 will be described. FIG. 5 is a diagram illustrating an example of the signal waveform of the drive signal COM. As illustrated in FIG. 5, the drive signal COM includes a trapezoidal waveform Adp for each cycle T. The trapezoidal waveform Adp includes a certain period at a voltage vc, a subsequent certain period at a voltage vb lower than the voltage vc after the certain period at the voltage vc, a subsequent certain period at a voltage vt higher than the voltage vc after the certain period at the voltage vb, and a subsequent certain period at a voltage vc after the certain period at the voltage vt. That is, the drive signal COM includes the trapezoidal waveform Adp in which the voltage changes between the voltage vt and the voltage vb and starts at the voltage vc and ends at the voltage vc in the cycle T.

The voltage vc corresponds to a potential that is a reference for the displacement of the piezoelectric element 60. The voltage of the drive signal COM supplied to the piezoelectric element 60 changes from the voltage vc to the voltage vb, and thus, the piezoelectric element 60 is driven in the up direction as illustrated in FIG. 4. As a result, the vibrating plate 621 is displaced in the up direction as illustrated in FIG. 4. When the vibrating plate 621 is displaced in the up direction as illustrated in FIG. 4, the internal volume of the cavity 631 is expanded, and the ink is drawn from the reservoir 641 into the cavity 631. Thereafter, the voltage of the drive signal COM supplied to the piezoelectric element 60 changes from the voltage vb to the voltage vt, and thus, the piezoelectric element 60 is driven in the down direction as illustrated in FIG. 4. As a result, the vibrating plate 621 is displaced in the down direction as illustrated in FIG. 4. When the vibrating plate 621 is displaced in the down direction as illustrated in FIG. 4, the internal volume of the cavity 631 is contracted, and the ink stored in the cavity 631 is ejected from the nozzle 651.

Moreover, for a certain period after the ink is ejected from the nozzle 651 by driving the piezoelectric element 60, the ink in the vicinity of the nozzle 651 or the vibrating plate 621 may continue to vibrate. The certain period at the voltage vc included in the drive signal COM also functions as a period for stopping such vibration not contributing to the ejection of the ink caused in the ink or the vibrating plate 621.

Here, the signal waveform of the drive signal COM illustrated in FIG. 5 is an example, is not limited thereto, and may include various shapes of signal waveforms corresponding to physical properties of the ink ejected by the liquid ejecting head 21, a length of the cycle T of the drive signal COM, a transport speed of the medium P, and the like.

1-3-2. Configuration of Drive Circuit

Figure 6:
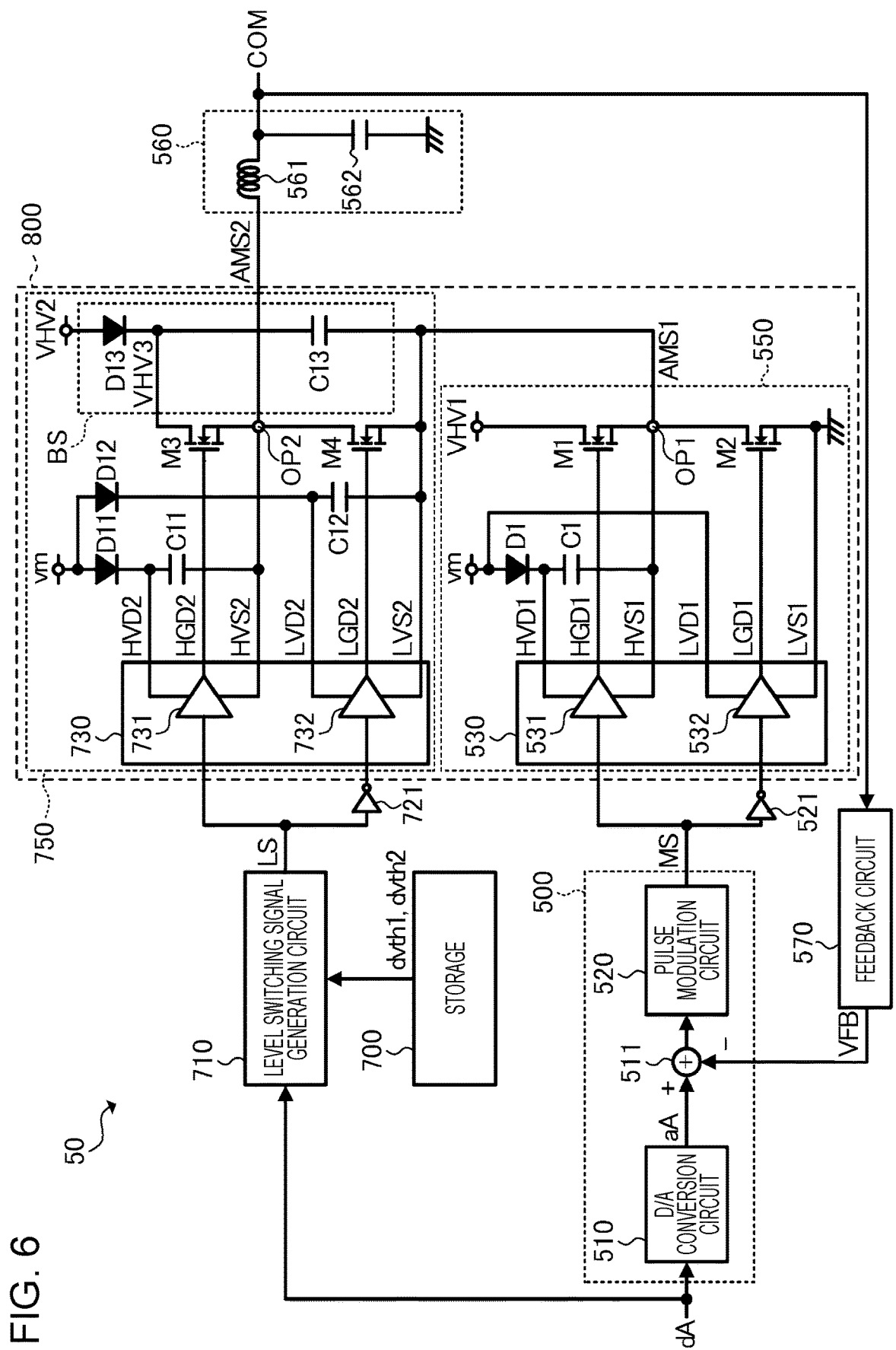
FIG. 6 is a diagram illustrating an example of a functional configuration of a drive circuit according to a first embodiment.

Next, the configuration of the drive circuit 50 will be described. FIG. 6 is a diagram illustrating an example of a functional configuration of the drive circuit 50 according to a first embodiment. As illustrated in FIG. 6, the drive circuit 50 includes a D/A conversion circuit 510, an adder 511, a pulse modulation circuit 520, an inverter 521, a demodulation circuit 560, a feedback circuit 570, a storage 700, a level switching signal generation circuit 710, and an amplification level shift circuit 800.

The base drive signal dA as the digital signal is input from the controller 100 to the D/A conversion circuit 510. The D/A conversion circuit 510 performs digital-to-analog conversion of the base drive signal dA, and then outputs the converted analog signal as a base drive signal aA. A voltage amplitude of the base drive signal aA is, for example, 1 to 2 V, and the drive circuit 50 outputs, as the drive signal COM, a signal obtained by amplifying the base drive signal aA. That is, the base drive signal aA corresponds to a target signal before the amplification of the drive signal COM.

The base drive signal aA is input to an input terminal of the adder 511 on a + side. A feedback signal VFB obtained by feeding back the drive signal COM via the feedback circuit 570 to be described later is input to an input terminal of the adder 511 on a − side. The adder 511 outputs, to the pulse modulation circuit 520, a signal obtained by subtracting the feedback signal VFB from the base drive signal aA.

The pulse modulation circuit 520 pulse-modulates the signal output by the adder 511 to generate a modulation signal MS. The modulation signal MS is a digital signal including a potential having an L level and a potential having an H level higher than the L level. The pulse modulation circuit 520 outputs the generated modulation signal MS to an amplification circuit 550. Such a pulse modulation circuit 520 generates a pulse density modulation signal (PDM signal) obtained by modulating the signal output by the adder 511 by a pulse density modulation (PDM) method, and outputs the PDM signal as the modulation signal MS to the amplification circuit 550. Specifically, the pulse modulation circuit 520 compares a voltage of the output signal of the adder 511 with a predetermined reference voltage vref. The pulse modulation circuit 520 generates the modulation signal MS, which is at the H level when the voltage of the output signal of the adder 511 is higher than the reference voltage vref and is at the L level when the voltage of the output signal of the adder 511 is lower than the reference voltage vref, and outputs the modulation signal MS.

As described above, the circuit including the D/A conversion circuit 510, the adder 511, and the pulse modulation circuit 520 functions as the modulation circuit 500 that modulates the base drive signal dA that is a base of the drive signal COM and outputs the modulation signal MS.

The level switching signal generation circuit 710 receives, an input, the base drive signal dA, and generates a level switching signal LS based on the base drive signal dA. The level switching signal LS is a digital signal including a potential having an L level and a potential having an H level higher than the L level. Specifically, when the level switching signal LS is at the L level, in a case where a value of the base drive signal dA increases and becomes larger than a first threshold dvth1, the level switching signal generation circuit 710 switches the level switching signal LS from the L level to the H level. Specifically, when the level switching signal LS is at the H level, in a case where the value of the base drive signal dA decreases and becomes smaller than a second threshold dvth2, the level switching signal generation circuit 710 switches the level switching signal LS from the H level to the L level.

The storage 700 stores the first threshold dvth1 and the second threshold dvth2. The storage 700 may be, for example, a non-volatile memory. Alternatively, the storage 700 may be a volatile memory, and the first threshold dvth1 and the second threshold dvth2 may be set in the storage 700 by external communication from the controller 100 or the like. In other words, the first threshold dvth1 and the second threshold dvth2 may be predetermined values, or may be rewritable from an outside of the drive circuit 50.

The amplification level shift circuit 800 includes transistors M1 and M2 switched in response to the modulation signal MS, and transistors M3 and M4 switched in response to the level switching signal LS, outputs an amplified modulation signal obtained by amplifying the modulation signal MS when the level switching signal LS is at the L level, and outputs a signal obtained by shifting the potential of the amplified modulation signal when the level switching signal LS is at the H level.

In the present embodiment, the amplification level shift circuit 800 includes the amplification circuit 550 and a level shift circuit 750. The amplification circuit 550 outputs a first amplified modulation signal AMS1 that is the amplified modulation signal obtained by amplifying the modulation signal MS by switching operations of the transistors M1 and M2. The level shift circuit 750 outputs the first amplified modulation signal AMS1 as the second amplified modulation signal AMS2 when the level switching signal LS is at the L level, and outputs, as the second amplified modulation signal AMS2, the signal obtained by shifting the potential of the first amplified modulation signal AMS1 when the level switching signal LS is at the H level by switching operations of the transistors M3 and M4. Hereinafter, configurations of the amplification circuit 550 and the level shift circuit 750 will be described in detail.

The amplification circuit 550 includes a gate drive circuit 530, a diode D1, a capacitor C1, and the transistors M1 and M2. The amplification circuit 550 generates a first amplified modulation signal AMS1 obtained by amplifying the modulation signal MS and outputs the first amplified modulation signal AMS1 from a first output point OP1.

The gate drive circuit 530 outputs a gate signal HGD1 and a gate signal LGD1 based on the modulation signal MS. Specifically, the modulation signal MS is input to a gate driver 531 included in the gate drive circuit 530, and the gate driver 531 generates the gate signal HGD1 obtained by level-shifting the modulation signal MS and outputs the gate signal HGD1 to the transistor M1. Moreover, the modulation signal MS is input to a gate driver 532 included in the gate drive circuit 530 after a logic level is inverted in the inverter 521, and the gate driver 532 generates the gate signal LGD1 obtained by level-shifting the signal in which the logic level of the modulation signal MS is inverted and outputs the gate signal LGD1 to the transistor M2.

Both the transistors M1 and M2 are N-channel MOSFETs. In the transistor M1, a source terminal which is one end is electrically coupled to the first output point OP1 from which the first amplified modulation signal AMS1 is output, and a voltage vhv1 of the voltage signal VHV1 is supplied as a power supply voltage to a drain terminal which is the other end. The transistor M1 operates based on the gate signal HGD1 input to a gate terminal. Moreover, in the transistor M2, a drain terminal which is one end is electrically coupled to the first output point OP1, and a ground potential is supplied to a source terminal which is the other end. The transistor M2 operates based on the gate signal LGD1 input to a gate terminal.

The transistor M1 operates based on the gate signal HGD1, and the transistor M2 operates based on the gate signal LGD1. Thus, the first amplified modulation signal AMS1 obtained by amplifying the modulation signal MS with the voltage vhv1 is generated at the first output point OP1.

Here, an operation of the gate drive circuit 530 will be described. The gate drive circuit 530 includes the gate drivers 531, and 532. As described above, the modulation signal MS is input to the gate driver 531, and the signal in which the logic level of the modulation signal MS is inverted by the inverter 521 is input to the gate driver 532. That is, the signal input to the gate driver 531 and the signal input to the gate driver 532 are exclusively at the H level. Here, a case where the signals are exclusively at the H level includes a case where the signals having the H level are not simultaneously input to the gate driver 531 and the gate driver 532. That is, a case where the signals having the L level are simultaneously input to the gate driver 531 and the gate driver 532 is not excluded.

A power supply terminal of the gate driver 531 on a low potential side is electrically coupled to the first output point OP1. Accordingly, a signal generated at the first output point OP1 is supplied as the voltage signal HVS1 to the power supply terminal of the gate driver 531 on the low potential side. Moreover, the power supply terminal of the gate driver 531 on a high potential side is electrically coupled to a cathode terminal of the diode D1 and one end of the capacitor C1. A voltage vm is supplied to an anode terminal of the diode D1, and the other end of the capacitor C1 is electrically coupled to the first output point OP1. That is, the diode D1 and the capacitor C1 constitute a bootstrap circuit, and an output voltage of the bootstrap circuit is supplied to the power supply terminal of the gate driver 531 on the high potential side. Accordingly, a voltage signal HVD1 having a voltage higher than the voltage signal HVS1 by the voltage vm input to the power supply terminal of the gate driver 531 on the low potential side is supplied to the power supply terminal of the gate driver 531 on the high potential side.

Thus, the gate driver 531 outputs the gate signal HGD1 having a voltage based on the voltage signal HVD1 having a voltage higher than a voltage at the first output point OP1 by the voltage vm when the modulation signal MS having the H level is input, and outputs the gate signal HGD1 having a voltage based on the voltage signal HVS1 which is the voltage at the first output point OP1 when the modulation signal MS having the L level is input.

Here, the voltage vm is a voltage that can drive each of the transistors M1 and M2 and transistors M3 and M4 to be described later, and is, for example, a DC voltage of 7.5 V. Such a voltage vm is generated, for example, by stepping down or boosting the voltage signals VHV1, VHV2, and VDD output by the power supply circuit 11.

A signal having a ground potential is supplied, as a voltage signal LVS1, to a power supply terminal of the gate driver 532 on the low potential side. Moreover, the voltage vm is supplied, as a voltage signal LVD1, to the power supply terminal of the gate driver 532 on the high potential side. Accordingly, the gate driver 532 outputs the gate signal LGD1 having a voltage based on the voltage signal LVD1 having the voltage vm when the signal having the H level in which the logic level of the modulation signal MS having the L level is inverted by the inverter 521 is input, and outputs the gate signal LGD1 having a voltage based on the voltage signal LVS1 having the ground potential when the signal having the L level in which the logic level of the modulation signal MS having the H level is inverted by the inverter 521 is input.

The level shift circuit 750 includes a gate drive circuit 730, diodes D11 and D12, capacitors C11 and C12, transistors M3 and M4, and a bootstrap circuit BS. The level shift circuit 750 outputs, as a second amplified modulation signal AMS2, the first amplified modulation signal AMS1 or a signal obtained by shifting a potential of the first amplified modulation signal AMS1 to a second output point OP2.

The gate drive circuit 730 outputs a gate signal HGD2 for driving the transistor M3 and a gate signal LGD2 for driving the transistor M4 based on the level switching signal LS. Specifically, the level switching signal LS is input to the gate driver 731 included in the gate drive circuit 730, and the gate driver 731 generates the gate signal HGD2 obtained by level-shifting the level switching signal LS and outputs the gate signal HGD2 to the transistor M3. Moreover, the level switching signal LS is input to the gate driver 732 included in the gate drive circuit 730 after the logic level is inverted in the inverter 721, and the gate driver 732 generates the gate signal LGD2 obtained by level-shifting the signal in which the logic level of the level switching signal LS is inverted and outputs the gate signal LGD2 to the transistor M4.

Both the transistors M3 and M4 are N-channel MOSFETs. In the transistor M3, a source terminal which is one end is electrically coupled to the second output point OP2 from which the second amplified modulation signal AMS2 is output, and a power supply voltage is supplied to a drain terminal which is the other end. Thus, the transistor M3 operates based on the gate signal HGD2 input to the gate terminal. Moreover, in the transistor M4, a drain terminal which is one end is electrically coupled to the second output point OP2, and the first amplified modulation signal AMS1 is supplied to a source terminal which is the other end. Thus, the transistor M4 operates based on the gate signal LGD2 input to a gate terminal.

The transistor M3 operates based on the gate signal HGD2, and the transistor M4 operates based on the gate signal LGD2. Thus, the first amplified modulation signal AMS1 or the signal obtained by shifting the potential of the first amplified modulation signal AMS1 is generated as the second amplified modulation signal AMS2 at the second output point OP2.

The bootstrap circuit BS includes a diode D13 and a capacitor C13. One end of the capacitor C13 is electrically coupled to the first output point OP1, the first amplified modulation signal AMS1 is supplied to the one end, and the other end is electrically coupled to the drain terminal of the transistor M3. The voltage signal VHV2 is supplied to an anode terminal of the diode D13, and a cathode terminal of the diode D13 is electrically coupled to the other end of the capacitor C13 and the drain terminal of the transistor M3. Although only one diode D13 is illustrated in FIG. 6, the bootstrap circuit BS may include a plurality of diodes D13 coupled in series. That is, the bootstrap circuit BS includes N diodes D13. N is a predetermined integer of 1 or more. Accordingly, a voltage vhv2−vf×N which is a difference between the voltage vhv2 of the voltage signal VHV2 and a sum vf×N of forward drop voltages of the N diodes D13 is supplied, as the power supply voltage, to the drain terminal of the transistor M3. When the transistor M2 of the amplification circuit 550 is energized, since charges are accumulated in the capacitor 13, a voltage between both ends of the capacitor 13 becomes the voltage vhv2−vf×N.

The bootstrap circuit BS generates a voltage signal VHV3 obtained by adding the voltage of the first amplified modulation signal AMS1 to the voltage vhv2−vf×N between both ends of the capacitor 13, and outputs the voltage signal VHV3 to the drain terminal of the transistor M3. In other words, the bootstrap circuit BS outputs the voltage signal VHV3 obtained by level-shifting the potential of the first amplified modulation signal AMS1 by the voltage vhv2−vf×N.

Here, an operation of the gate drive circuit 730 will be described. The gate drive circuit 730 includes the gate drivers 731 and 732. As described above, the level switching signal LS is input to the gate driver 731, and a signal in which the logic level of the level switching signal LS is inverted by the inverter 721 is input to the gate driver 732. That is, the signal input to the gate driver 731 and the signal input to the gate driver 732 are exclusively at the H level. Here, a case where the signals are exclusively at the H level includes a case where the signals having the H level are not simultaneously input to the gate driver 731 and the gate driver 732. That is, a case where the signals having the L level are simultaneously input to the gate driver 731 and the gate driver 732 is not excluded.

A power supply terminal of the gate driver 731 on the low potential side is coupled to the second output point OP2. Accordingly, a signal generated at the second output point OP2 is supplied as a voltage signal HVS2 to the power supply terminal of the gate driver 731 on the low potential side. Moreover, a power supply terminal of the gate driver 731 on the high potential side is electrically coupled to a cathode terminal of the diode D11 and one end of the capacitor C11. Moreover, the voltage vm is supplied to an anode terminal of the diode D11, and the other end of the capacitor C11 is electrically coupled to the second output point OP2. That is, the diode D11 and the capacitor C11 constitute a bootstrap circuit, and an output voltage of the bootstrap circuit is supplied to the power supply terminal of the gate driver 731 on the high potential side. Accordingly, a voltage signal HVD2 having a voltage higher than the voltage signal HVS2 by the voltage vm input to the power supply terminal of the gate driver 731 on the low potential side is supplied to the power supply terminal of the gate driver 731 on the high potential side. Thus, the gate driver 731 outputs the gate signal HGD2 having a voltage based on the voltage signal HVD2 having a voltage higher than a voltage at the second output point OP2 by the voltage vm when the level switching signal LS having the H level is input, and outputs the gate signal HGD2 having the voltage based on the voltage signal HVS2 which is the voltage at the second output point OP2 when the level switching signal LS having the L level is input.

A power supply terminal of the gate driver 732 on the low potential side is coupled to the first output point OP1. Accordingly, the first amplified modulation signal AMS1 generated at the first output point OP1 is supplied, as a voltage signal LVS2, to the power supply terminal of the gate driver 732 on the low potential side. Moreover, a power supply terminal of the gate driver 732 on the high potential side is electrically coupled to a cathode terminal of the diode D12 and one end of the capacitor C12. Moreover, the voltage vm is supplied to an anode terminal of the diode D12, and the other end of the capacitor C12 is electrically coupled to the first output point OP1. That is, the diode D12 and the capacitor C12 constitute a bootstrap circuit, and an output voltage of the bootstrap circuit is supplied to the power supply terminal of the gate driver 732 on the high potential side. Accordingly, a voltage signal LVD2 having a voltage higher than the voltage signal LVS2 by the voltage vm input to the power supply terminal of the gate driver 732 on the low potential side is supplied to the power supply terminal of the gate driver 732 on the high potential side.

Thus, the gate driver 732 outputs the gate signal LGD2 having a voltage based on the voltage signal LVD2 having a voltage higher than the voltage at the first output point OP1 by the voltage vm when the signal having the H level in which the logic level of the level switching signal LS having the L level is inverted by the inverter 721 is input, and outputs the gate signal HGD2 having a voltage based on the voltage signal LVS2 which is the voltage at the first output point OP1 when the signal having the L level in which the logic level of the level switching signal LS having the H level is inverted by the inverter 721.

In the level shift circuit 750 having the above-described configuration, when the level switching signal generation circuit 710 outputs the level switching signal LS having the L level, the first output point OP1 of the amplification circuit 550 and the second output point OP2 of the level shift circuit 750 are electrically coupled via the transistor M4. Accordingly, when the level switching signal LS is at the L level, the level shift circuit 750 outputs, as the second amplified modulation signal AMS2, the first amplified modulation signal AMS1 supplied to the second output point OP2 via the transistor M4.

On the other hand, when the level switching signal generation circuit 710 outputs the level switching signal LS having the H level, the first output point OP1 of the amplification circuit 550 and the second output point OP2 of the level shift circuit 750 are electrically coupled via the bootstrap circuit BS and the transistor M3. Accordingly, when the level switching signal LS is at the H level, the level shift circuit 750 outputs, as the second amplified modulation signal AMS2, the voltage signal VHV3 as a signal obtained by shifting the potential of the first amplified modulation signal AMS1 by the voltage vhv2−vf×N of the voltage signal VHV2.

In the following description, an operation mode in which the level shift circuit 750 outputs the first amplified modulation signal AMS1 as the second amplified modulation signal AMS2 is referred to as a first mode MD1, and an operation mode in which the level shift circuit 750 outputs, as the second amplified modulation signal AMS2, the signal obtained by level-shifting the potential of the first amplified modulation signal AMS1 is referred to as a second mode MD2. That is, the level shift circuit 750 is in the first mode MD1 when the level switching signal LS is at the L level, and is in the second mode MD2 when the level switching signal LS is at the H level.

For example, when the value of the base drive signal dA is smaller than the first threshold dvth1, the level switching signal generation circuit 710 outputs the level switching signal LS having the L level, and the operation mode of the level shift circuit 750 is set to the first mode MD1. Thereafter, the value of the base drive signal dA becomes larger than the first threshold dvth1, and thus, the level switching signal generation circuit 710 switches the level switching signal LS from the L level to the H level. Consequently, the operation mode of the level shift circuit 750 is switched from the second mode MD2 to the first mode MD1. In order to reduce waveform distortion of the drive signal COM that may occur due to the switching of the operation mode of the level shift circuit 750 immediately after the level switching signal LS is switched from the L level to the H level, the level switching signal generation circuit 710 outputs, as the level switching signal LS, a pulse signal that is at the L level for a short period one or a plurality of times.

Moreover, when the value of the base drive signal dA is larger than the second threshold dvth2, the level switching signal generation circuit 710 outputs the level switching signal LS having the H level, and the operation mode of the level shift circuit 750 is set to the second mode MD2. Thereafter, the value of the base drive signal dA becomes smaller than the second threshold dvth2, and thus, the level switching signal generation circuit 710 switches the level switching signal LS from the H level to the L level. Consequently, the operation mode of the level shift circuit 750 is switched from the second mode MD2 to the first mode MD1. In order to reduce the waveform distortion of the drive signal COM that may occur due to the switching of the operation mode of the level shift circuit 750 immediately after the level switching signal LS is switched from the H level to the L level, the level switching signal generation circuit 710 outputs, as the level switching signal LS, a pulse signal that is at the H level for a short period one or a plurality of times.

Here, in the following description, the pulse signal that is at the L level for a short period when the operation mode of the level shift circuit 750 is switched from the first mode MD1 to the second mode MD2 and the pulse signal that is at the H level for a short period when the operation mode of the level shift circuit 750 is switched from the second mode MD2 to the first mode MD1 may be collectively referred to as a counter pulse CP.

The second amplified modulation signal AMS2 output by the level shift circuit 750 is input to the demodulation circuit 560. The demodulation circuit 560 demodulates the second amplified modulation signal AMS2 output by the level shift circuit 750 by smoothing, and outputs the drive signal COM.

The demodulation circuit 560 includes an inductor 561 and a capacitor 562. One end of the inductor 561 is electrically coupled to the second output point OP2. The other end of the inductor 561 is electrically coupled to one end of the capacitor 562. A ground potential is supplied to the other end of the capacitor 562. That is, the inductor 561 and the capacitor 562 constitute a low-pass filter circuit. Due to this low-pass filter circuit, the second amplified modulation signal AMS2 output from the level shift circuit 750 is smoothed and output, as the drive signal COM, from the drive circuit 50.

The feedback circuit 570 receives, as an input, the drive signal COM generated by the demodulation circuit 560 and outputs the feedback signal VFB to the modulation circuit 500. Specifically, the feedback circuit 570 supplies the feedback signal VFB obtained by dividing the drive signal COM to the adder 511. Consequently, the drive signal COM is fed back to the pulse modulation circuit 520. As a result, the waveform accuracy of the drive signal COM output by the drive circuit 50 is improved. Here, the feedback circuit 570 may feed back, as the feedback signal VFB, a plurality of signals including signals obtained by dividing the drive signal COM and a signal obtained by extracting high frequency components of the drive signal COM. That is, the feedback circuit 570 may include a plurality of feedback circuits including a circuit that feeds back the signals obtained by dividing the drive signal COM and a circuit that feeds back the signals obtained by extracting the high frequency components of the drive signal COM. Consequently, the high frequency components included in the drive signal COM can be individually fed back. As a result, the drive circuit 50 can be self-excited and oscillate based on the high frequency component, and a frequency of the modulation signal MS can be set to be high enough to sufficiently ensure the accuracy of the drive signal COM. Accordingly, the waveform accuracy of the drive signal COM output by the drive circuit 50 is further improved.

1-3-3. Operation of Drive Circuit

Figure 7:
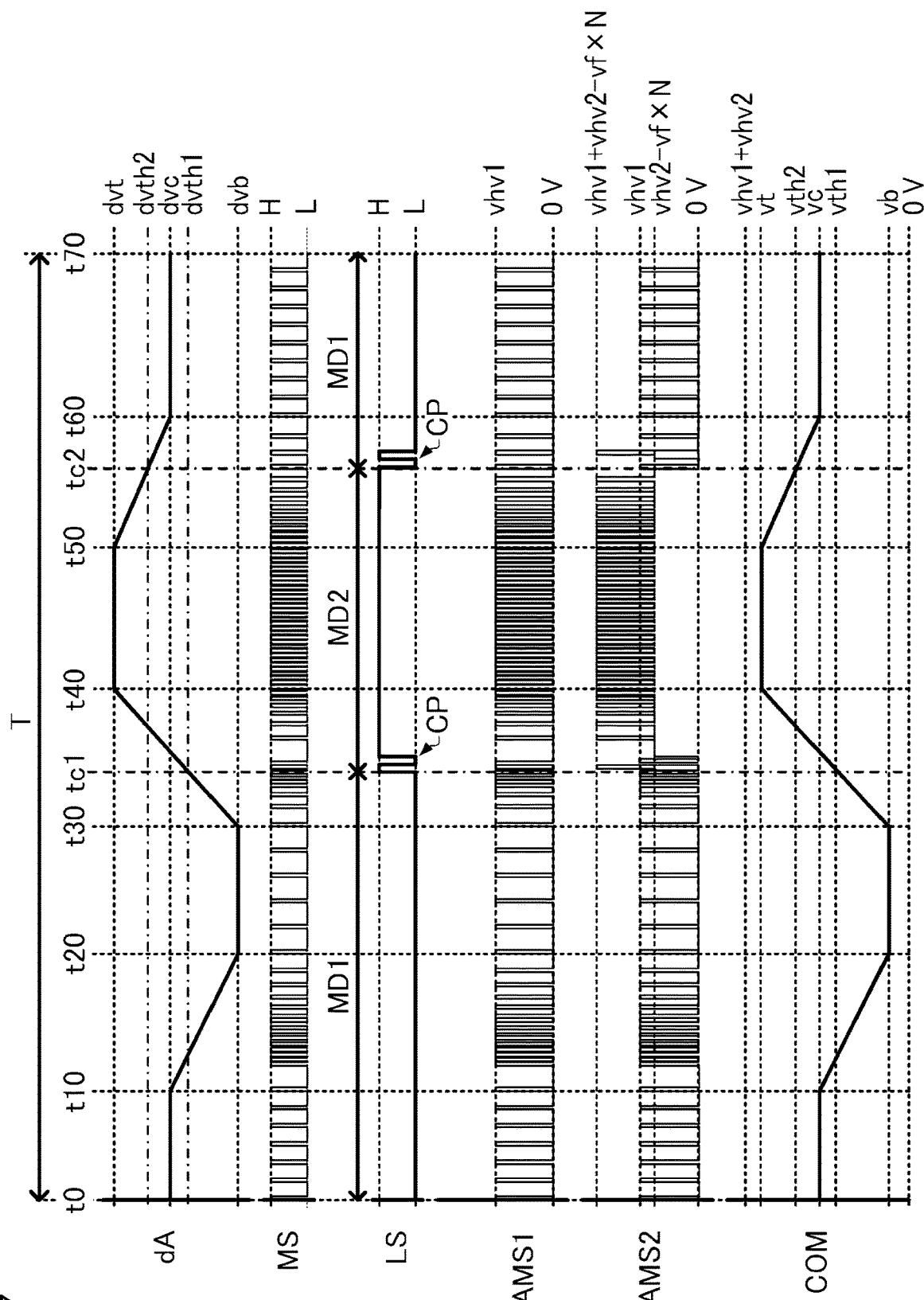
FIG. 7 is a diagram for describing an operation of the drive circuit.

Next, an operation of the drive circuit 50 will be described. FIG. 7 is a diagram for describing the operation of the drive circuit 50. In addition, FIG. 7 illustrates only the drive signal COM in any cycle T in the drive signal COM output by the drive circuit 50. In FIG. 7, for the sake of convenience in illustration and description, a signal waveform in an ideal case where there is no circuit delay or wiring delay is illustrated. Moreover, in FIG. 7, the voltages of the drive signals COM corresponding to the first threshold dvth1 and the second threshold dvth2, respectively, are illustrated as vth1 and vth2. Further, digital values of the base drive signal dA corresponding to the voltages vt, vb, and vc of the drive signal COM are illustrated as dvt, dvb, and dvc, respectively. In addition, FIG. 7 illustrates a case where a voltage vth1 is lower than the voltage vc and the first threshold dvth1 is smaller than a digital value dvc and a case where a voltage vth2 is higher than the voltage vc and the second threshold dvth2 is larger than a digital value dvc, but the present disclosure is not limited thereto.

As illustrated in FIG. 7, in a period from time t0 to time t10, the base drive signal dA having the digital value dvc is input to the D/A conversion circuit 510, and the drive circuit 50 outputs the drive signal COM having the voltage vc. Since the digital value dvc is smaller than the second threshold dvth2, the level switching signal generation circuit 710 generates the level switching signal LS having the L level. As a result, the operation mode of the level shift circuit 750 is set to the first mode MD1, and the level shift circuit 750 outputs the first amplified modulation signal AMS1 as the second amplified modulation signal AMS2.

In a period from time t10 to time t20, the base drive signal dA that decreases from the digital value dvc to the digital value dvb is input to the D/A conversion circuit 510, and the drive circuit 50 outputs the drive signal COM that decreases from the voltage vc to the voltage vb. In the period from time t10 to time t20, since the digital value of the base drive signal dA is smaller than the second threshold dvth2, the level switching signal generation circuit 710 generates the level switching signal LS having the L level. As a result, the operation mode of the level shift circuit 750 is maintained at the first mode MD1, and the level shift circuit 750 outputs the first amplified modulation signal AMS1 as the second amplified modulation signal AMS2.

In a period from time t20 to time t30, the base drive signal dA having the digital value dvb is input to the D/A conversion circuit 510, and the drive circuit 50 outputs the drive signal COM having the voltage vb. Since the digital value dvb is smaller than the first threshold dvth1, the level switching signal generation circuit 710 generates the level switching signal LS having the L level. As a result, the operation mode of the level shift circuit 750 is maintained at the first mode MD1, and the level shift circuit 750 outputs the first amplified modulation signal AMS1 as the second amplified modulation signal AMS2.

In a period from time t30 to time t40, the base drive signal dA that increases from the digital value dvb to the digital value dvt is input to the D/A conversion circuit 510, and the drive circuit 50 outputs the drive signal COM that rises from the voltage vb to the voltage vt. Within the period from time t30 to time t40, in a period from time t30 to time tc1, since the digital value of the base drive signal dA is smaller than the first threshold dvth1, the level switching signal generation circuit 710 generates the level switching signal LS having the L level. As a result, the operation mode of the level shift circuit 750 is maintained at the first mode MD1, and the level shift circuit 750 outputs the first amplified modulation signal AMS1 as the second amplified modulation signal AMS2. On the other hand, within the period from time t30 to time t40, in a period from time tc1 to time t40, since the digital value of the base drive signal dA is larger than the first threshold dvth1, the level switching signal generation circuit 710 generates the level switching signal LS having the H level. As a result, the operation mode of the level shift circuit 750 transitions from the first mode MD1 to the second mode MD2, and the level shift circuit 750 outputs, as the second amplified modulation signal AMS2, the signal obtained by shifting the potential of the first amplified modulation signal AMS1.

When the operation mode of the level shift circuit 750 transitions from the first mode MD1 to the second mode MD2, the reference potential of the first amplified modulation signal AMS1 output as the second amplified modulation signal AMS2 steeply changes from the ground potential to the voltage vhv2−vf×N. When a response speed of the drive circuit 50 cannot follow the steep change in the reference potential, there is a possibility that the signal waveform of the drive signal COM is distorted. In order to reduce the distortion of the signal waveform of the drive signal COM, at time tc1, after the operation mode of the level shift circuit 750 transitions from the first mode MD1 to the second mode MD2, the level switching signal generation circuit 710 outputs the counter pulse CP for inverting the logic level of the level switching signal LS for a short period. In a period in which the level switching signal generation circuit 710 outputs the counter pulse CP, the operation mode of the level shift circuit 750 is set to the first mode MD1 or the second mode MD2 in accordance with the logic level of the level switching signal LS, and the level shift circuit 750 outputs, as the second amplified modulation signal AMS2, the first amplified modulation signal AMS1 or the signal obtained by shifting the potential of the first amplified modulation signal AMS1. Due to the counter pulse CP, the change in the reference potential of the first amplified modulation signal AMS1 output as the second amplified modulation signal AMS2 is gradual. As a result, the distortion of the signal waveform of the drive signal COM is reduced.

As described above, in the period from time t30 to time t40, the drive circuit 50 outputs the drive signal COM that increases from the voltage vb to the voltage vt. At this time, a current is supplied to the piezoelectric element 60 and the demodulation circuit 560 by the second amplified modulation signal AMS2 output by the drive circuit 50, and charges are stored. The current for storing the charges in the piezoelectric element 60 and the demodulation circuit 560 is supplied via the capacitor C13. Thus, the charges stored in the capacitor C13 are released, and the possibility that the voltage of the capacitor C13 decreases is increased. In the period from time t30 to time t40, the level shift circuit 750 outputs the counter pulse CP, and thus, in a period in which the level switching signal LS is at the L level, the current is supplied to the piezoelectric element 60 and the demodulation circuit 560 without passing through the capacitor C13. That is, in the period from time t30 to time t40, the counter pulse CP is output, and thus, the possibility that the charges stored in the capacitor C13 of the bootstrap circuit BS are released is reduced. As a result, the possibility that the signal waveform of the drive signal COM is distorted due to the decrease in the voltage of the capacitor C13 is reduced.

In a period from time t40 to time t50, the base drive signal dA having the digital value dvt is input to the D/A conversion circuit 510, and the drive circuit 50 outputs the drive signal COM having the voltage vt. Since the digital value dvt is larger than the second threshold dvth2, the level switching signal generation circuit 710 generates the level switching signal LS having the H level. As a result, the operation mode of the level shift circuit 750 is maintained at the second mode MD2, and the level shift circuit 750 outputs, as the second amplified modulation signal AMS2, the signal obtained by shifting the potential of the first amplified modulation signal AMS1.

In a period from time t50 to time t60, the base drive signal dA that decreases from the digital value dvt to the digital value dvc is input to the D/A conversion circuit 510, and the drive circuit 50 outputs the drive signal COM that decreases from the voltage vt to the voltage vc. Within the period from time t50 to time t60, in a period from time t50 to time tc2, since the digital value of the base drive signal dA is larger than the second threshold dvth2, the level switching signal generation circuit 710 generates the level switching signal LS having the H level. As a result, the operation mode of the level shift circuit 750 is maintained at the second mode MD2, and the level shift circuit 750 outputs, as the second amplified modulation signal AMS2, the signal obtained by shifting the potential of the first amplified modulation signal AMS1. On the other hand, within the period from time t50 to time t60, in a period from time tc2 to time t60, since the digital value of the base drive signal dA is smaller than the second threshold dvth2, the level switching signal generation circuit 710 generates the level switching signal LS having the L level. As a result, the operation mode of the level shift circuit 750 transitions from the second mode MD2 to the first mode MD1, and the level shift circuit 750 outputs the first amplified modulation signal AMS1 as the second amplified modulation signal AMS2.

When the operation mode of the level shift circuit 750 transitions from the second mode MD2 to the first mode MD1, a reference potential of the first amplified modulation signal AMS1 output as the second amplified modulation signal AMS2 steeply changes from the voltage vhv2−vf×N to the ground potential. When a response speed of the drive circuit 50 cannot follow the steep change in the reference potential, there is a possibility that the signal waveform of the drive signal COM is distorted. In order to reduce the distortion of the signal waveform of the drive signal COM, at time tc2, after the operation mode of the level shift circuit 750 transitions from the second mode MD2 to the first mode MD1, the level switching signal generation circuit 710 outputs the counter pulse CP for inverting the logic level of the level switching signal LS for a short period. In a period in which the level switching signal generation circuit 710 outputs the counter pulse CP, the operation mode of the level shift circuit 750 is set to the first mode MD1 or the second mode MD2 in accordance with the logic level of the level switching signal LS, and the level shift circuit 750 outputs, as the second amplified modulation signal AMS2, the first amplified modulation signal AMS1 or the signal obtained by shifting the potential of the first amplified modulation signal AMS1. Due to the counter pulse CP, the change in the reference potential of the first amplified modulation signal AMS1 output as the second amplified modulation signal AMS2 is gradual. As a result, the distortion of the signal waveform of the drive signal COM is reduced.

As described above, in the period from time t50 to time t60, the drive circuit 50 outputs the drive signal COM that decreases from the voltage vt to the voltage vc. At this time, the charges stored in the piezoelectric element 60 and the demodulation circuit 560 are released, and a current generated by the release of the charges is supplied to the drive circuit 50. In such a period from time t50 to time t60, the level shift circuit 750 outputs the counter pulse CP, and thus, in a period in which the level switching signal LS is at the H level, the current supplied to the drive circuit 50 is supplied to the capacitor C13 via the transistor M3. That is, in the period from time t50 to time t60, the counter pulse CP is output, and thus, a regenerative current flows through the capacitor C13 of the bootstrap circuit BS. As a result, charges are stored in the capacitor C13. As a result, the possibility that the signal waveform of the drive signal COM is distorted due to the decrease in the voltage of the capacitor C13 is reduced.

In a period from time t60 to time t70, the base drive signal dA having the digital value dvc is input to the D/A conversion circuit 510, and the drive circuit 50 outputs the drive signal COM having the voltage vc. Since the digital value dvc is smaller than the second threshold dvth2, the level switching signal generation circuit 710 generates the level switching signal LS having the L level. As a result, the operation mode of the level shift circuit 750 is maintained at the first mode MD1, and the level shift circuit 750 outputs the first amplified modulation signal AMS1 as the second amplified modulation signal AMS2.

1-3-4. Operation of Level Switching Signal Generation Circuit

As described above, when the level switching signal LS is at the L level, the first amplified modulation signal AMS1 generated at the first output point OP1 by the switching operations of the transistors M1 and M2 of the amplification circuit 550 is output as the second amplified modulation signal AMS2 from the second output point OP2 of the level shift circuit 750. In a voltage range of the second amplified modulation signal AMS2, an upper limit is the voltage vhv1, and a lower limit is the ground potential (0 V). On the other hand, when the level switching signal LS is at the H level, the signal obtained by shifting the potential of the first amplified modulation signal AMS1 generated at the first output point OP1 is output as the second amplified modulation signal AMS2 from the second output point OP2 of the level shift circuit 750. In a voltage range of the second amplified modulation signal AMS2, an upper limit is a voltage vhv1+vhv2−vf×N, and a lower limit is a voltage vhv2−vf×N. Hereinafter, the voltage range of the second amplified modulation signal AMS2 when the level switching signal LS is at the L level is referred to as a "low voltage output range LV", and the voltage range of the second amplified modulation signal AMS2 when the level switching signal LS is at the H level is referred to as a "high voltage output range HV".

Figure 8:
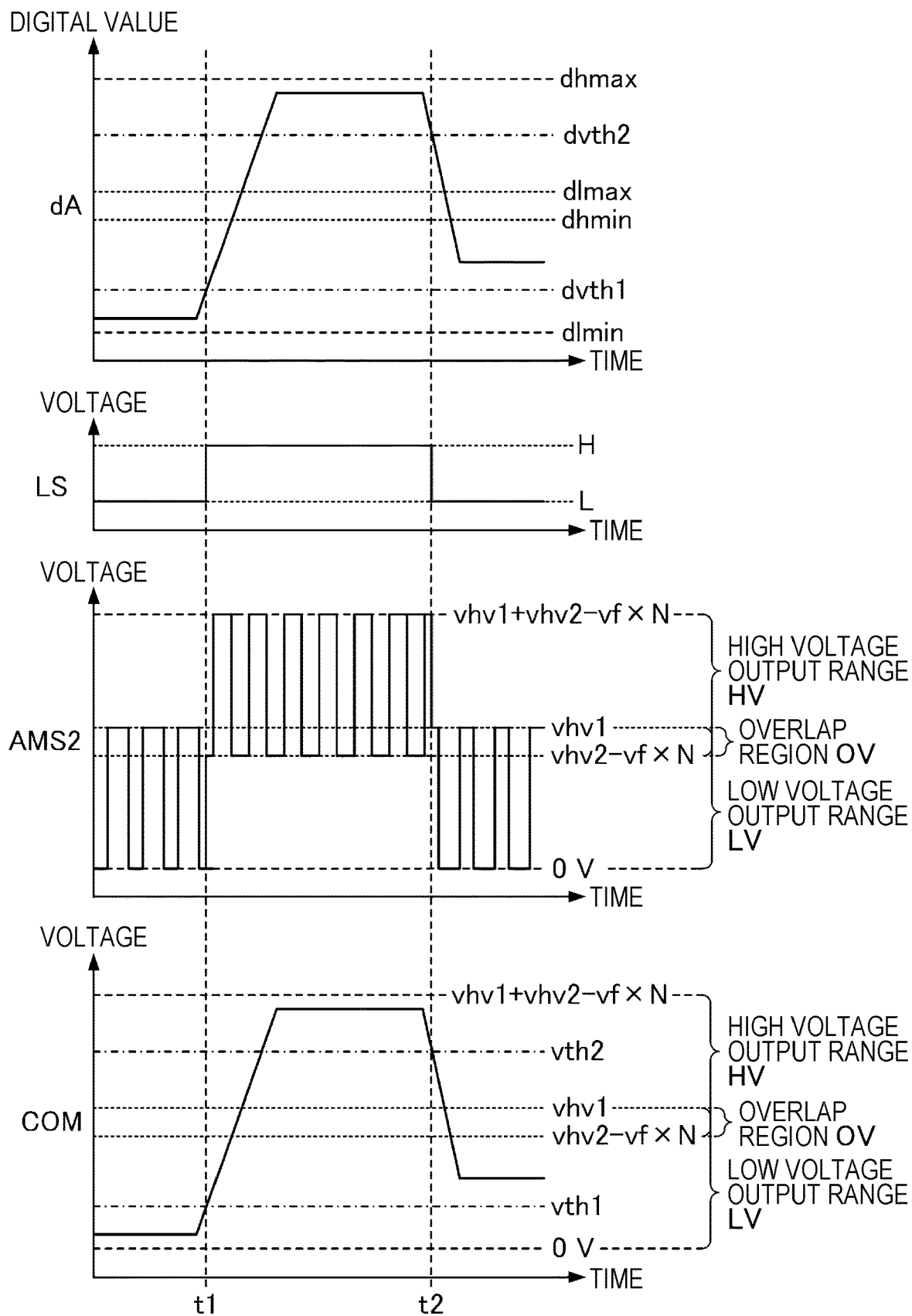
FIG. 8 is a diagram illustrating an example of waveforms of a base drive signal, a switching signal, a second amplified modulation signal, and a drive signal.

FIG. 8 illustrates an example of waveforms of the base drive signal dA, the level switching signal LS, the second amplified modulation signal AMS2, and the drive signal COM. In FIG. 8, for the sake of convenience in illustration and description, the waveform of the drive signal COM is illustrated as having no delay. In the example of FIG. 8, in a period before time t1, the value of the base drive signal dA is smaller than the first threshold dvth1, and the level switching signal LS is at the L level. Moreover, at time t1, the value of the base drive signal dA is larger than the first threshold dvth1, the level switching signal LS is switched from the L level to the H level. At time t2, the value of the base drive signal dA becomes smaller than the second threshold dvth2, and the level switching signal LS is switched from the H level to the L level. Moreover, in a period after time t2, the value of the base drive signal dA is smaller than the second threshold dvth2, and the level switching signal LS is at the L level.

In the period before time t1 and the period after time t2, since the level switching signal LS is at the L level, the voltage of the second amplified modulation signal AMS2 is alternately repeated between the ground potential (0 V), which is a lower limit voltage of the low voltage output range LV and the voltage vhv1 that is an upper limit voltage of the low voltage output range LV. In a period from time t1 to time t2, since the level switching signal LS is at the H level, the voltage of the second amplified modulation signal AMS2 is alternately repeated between the voltage vhv2−vf×N that is a lower limit voltage of the high voltage output range HV and the voltage vhv1+vhv2−vf×N that is an upper limit voltage of the high voltage output range HV. When the voltage vhv1 and the voltage vhv2 are equal to each other, since the voltage vhv1 that is the upper limit voltage of the low voltage output range LV is higher than the voltage vhv2−vf×N that is the lower limit voltage of the high voltage output range HV, there is an overlap region OV of the low voltage output range LV and the high voltage output range HV. In the overlap region OV, a lower limit voltage is the voltage vhv2−vf×N, and an upper limit voltage is the voltage vhv1. The voltage vhv2−vf×N that is the lower limit voltage of the overlap region OV is the power supply voltage supplied to the drain terminal which is one end of the transistor M3. Moreover, the voltage vhv1 that is the upper limit voltage of the overlap region OV is the power supply voltage supplied to the drain terminal which is one end of the transistor M1.

In FIG. 8, values dlmax and dlmin of the base drive signal dA are values corresponding to the voltage vhv1 that is the upper limit voltage and the ground potential (0 V) that is the lower limit voltage of the low voltage output range LV, respectively. Moreover, values dhmax and dhmin of the base drive signal dA are values corresponding to the voltage vhv1+vhv2−vf×N that is the upper limit voltage and the voltage vhv2−vf×N that is the lower limit voltage of the high voltage output range HV, respectively. Accordingly, the values dhmin and dlmax of the base drive signal dA are values corresponding to the lower limit voltage and the upper limit voltage of the overlap region OV, respectively.

The voltage of the drive signal COM is changed between the ground potential (0 V) which is the lower limit voltage of the low voltage output range LV and the voltage vhv1+vhv2−vf×N that is the upper limit voltage of the high voltage output range HV in accordance with the change in the value of the base drive signal dA.

As described above, when the level switching signal LS is at the L level, in a case where a value of the base drive signal dA increases and becomes larger than a first threshold dvth1, the level switching signal generation circuit 710 switches the level switching signal LS from the L level to the H level. Further, the level switching signal generation circuit 710 switches the level switching signal LS from the L level to the H level, and then switches the level switching signal from the H level to the L level, and further switches the level switching signal from the L level to the H level. That is, the level switching signal generation circuit 710 outputs the counter pulse CP for inverting the logic level of the level switching signal LS for a predetermined period.

Moreover, as described above, when the level switching signal LS is at the H level, in a case where the value of the base drive signal dA decreases and becomes smaller than a second threshold dvth2, the level switching signal generation circuit 710 switches the level switching signal LS from the H level to the L level. Further, the level switching signal generation circuit 710 switches the level switching signal LS from the H level to the L level, and then switches the level switching signal from the L level to the H level, and further switches the level switching signal from the H level to the L level. That is, the level switching signal generation circuit 710 outputs the counter pulse CP for inverting the logic level of the level switching signal LS for a predetermined period.

The counter pulse CP is used for reducing distortion of the signal waveform of the drive signal COM due to the change in the logic level of the level switching signal LS and the occurrence of the switching operations of the transistors M3 and M4. Thus, the counter pulse CP needs to be output in a period in which the voltage of the drive signal COM rises or decreases. When the counter pulse CP is output in a period in which the voltage of the drive signal COM is constant, the signal waveform of the drive signal COM may be distorted by the counter pulse CP.

Although the voltage of the drive signal COM changes in accordance with the change in the value of the base drive signal dA, the voltage of the drive signal COM changes with a delay with respect to the change of the base drive signal dA due to the circuit delays of the modulation circuit 500, the amplification circuit 550, and the level shift circuit 750. Accordingly, the level switching signal generation circuit 710 needs to output the counter pulse CP in the period in which the voltage of the drive signal COM changes in consideration of the delay time duration.

Figure 9:
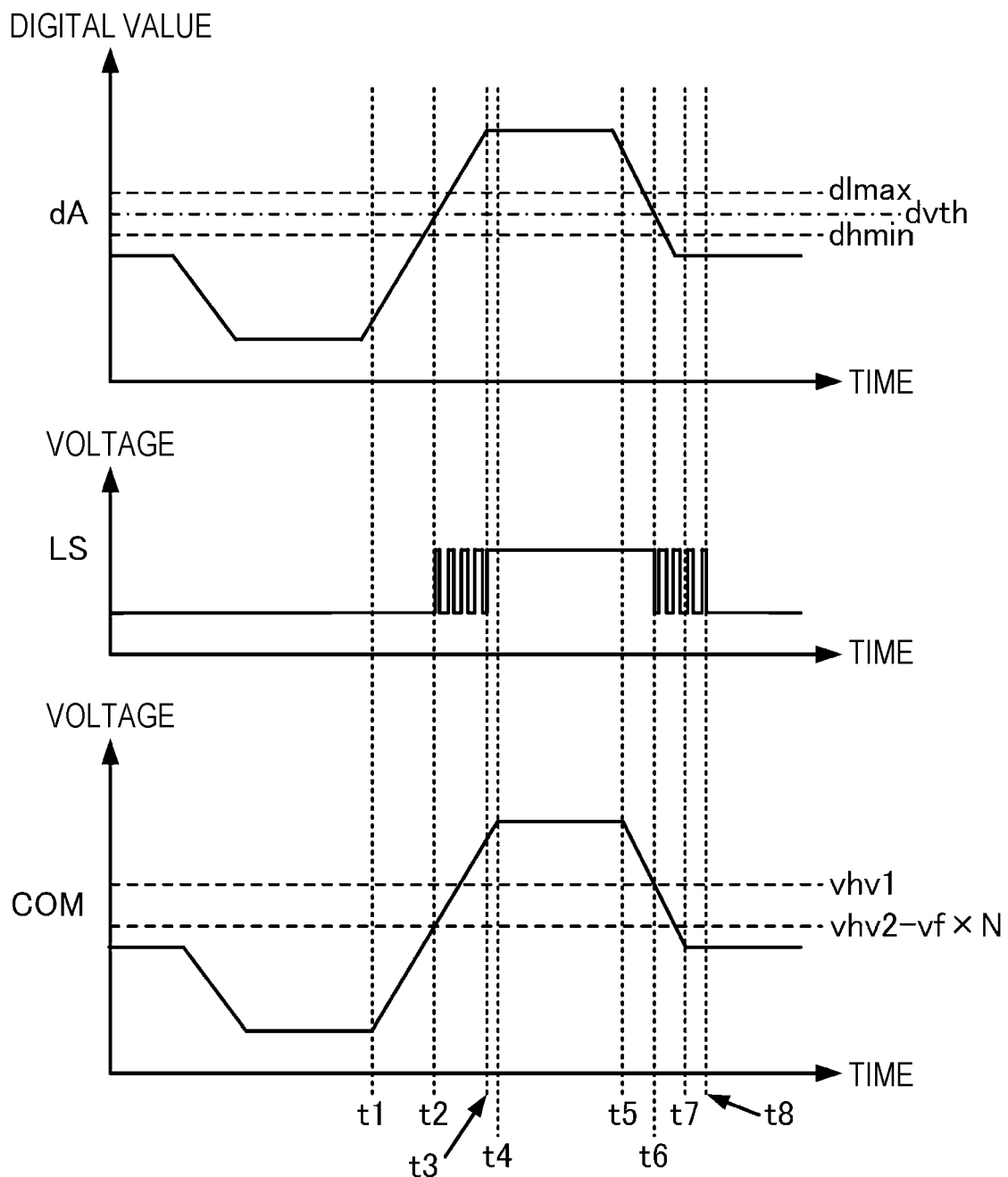
FIG. 9 is a diagram illustrating an example of waveforms of a base drive signal, a level switching signal, and a drive signal according to a comparative example.

Here, assuming a comparative example in which the level switching signal generation circuit 710 changes the logic level of the level switching signal LS based on one threshold dvth, FIG. 9 illustrates an example of waveforms of a base drive signal dA, a level switching signal LS, and a drive signal COM according to the comparative example. Moreover, FIG. 10 illustrates an example of waveforms of the base drive signal dA, the level switching signal LS, and the drive signal COM according to the present embodiment.

In the example of FIG. 9, the threshold dvth is set to a value that is larger than the value dhmin corresponding to the lower limit voltage of the overlap region OV and is smaller than the value dlmax corresponding to the upper limit voltage of the overlap region OV. The voltage of the drive signal COM rises in a period from time t1 to time t4, and the voltage of the drive signal COM decreases in a period from time t5 to time t7. The counter pulse CP is output in a period from time t2 to time t3 and a period from time t6 to time t8. The period from time t2 to time t3 in which the counter pulse CP is output is included in the period from time t1 to time t4 in which the voltage of the drive signal COM rises. On the other hand, within the period from time t6 to time t8 in which the counter pulse CP is output, a period from time t6 to time t7 is included in a period from time t5 to time t8 in which the voltage of the drive signal COM decreases, and a period from time t7 to time t8 is included in a period after time t7 in which the voltage of the drive signal COM is constant. Thus, the signal waveform of the drive signal COM may be distorted. It is not easy to set one threshold dvth such that the counter pulse CP is output only in the period in which the voltage of the drive signal COM rises and the period in which the voltage of the drive signal COM decreases in consideration of the delay time duration of the drive signal COM, and the setting may not be able to be performed such as a case where the period in which the voltage of the drive signal COM changes is short.

Figure 10:
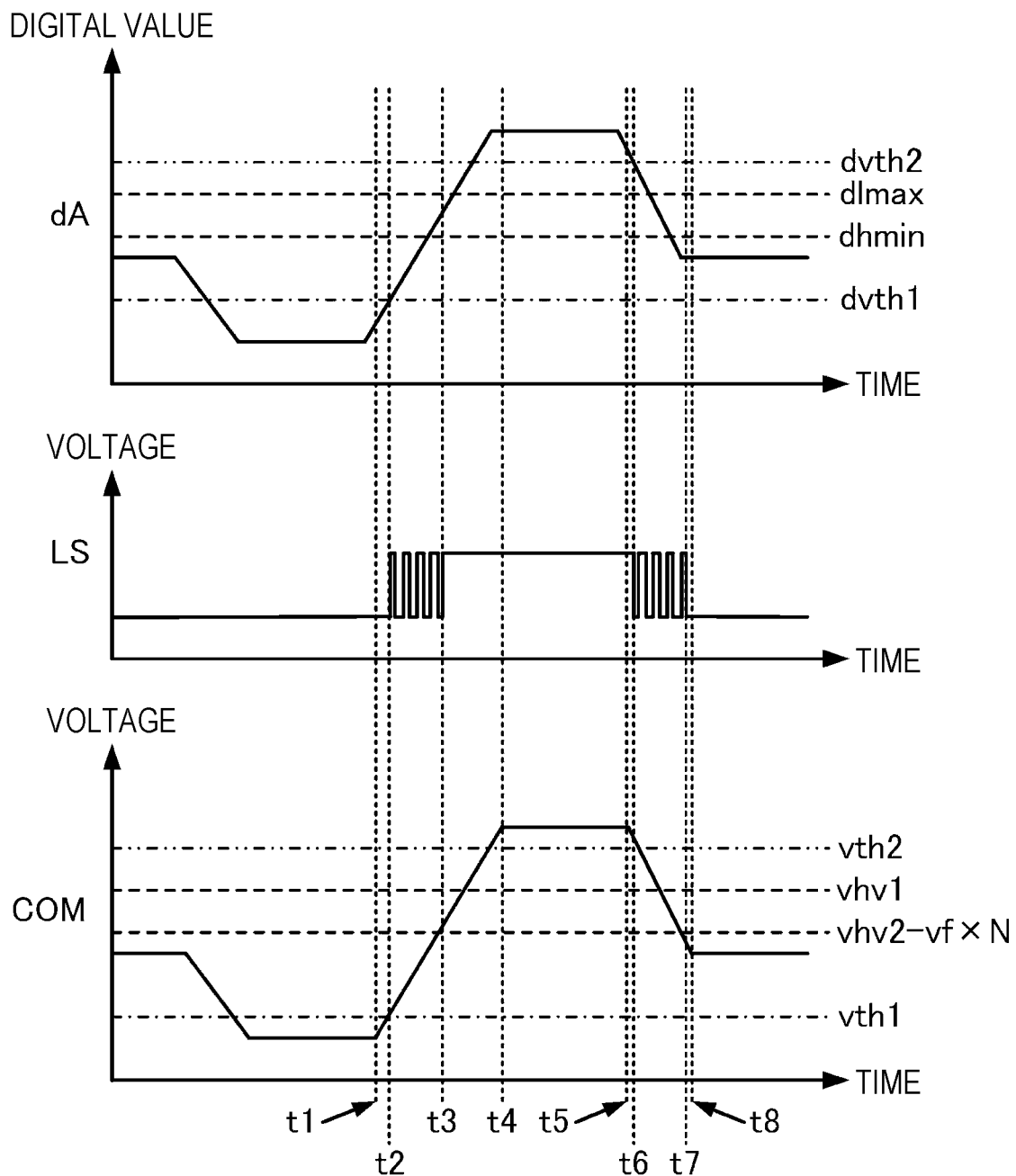
FIG. 10 is a diagram illustrating an example of waveforms of a base drive signal, a level switching signal, and a drive signal according to the first embodiment.

On the other hand, in the present embodiment, as illustrated in FIG. 10, the first threshold dvth1 is set to a value smaller than the value dhmin corresponding to the lower limit voltage of the overlap region OV, and the second threshold dvth2 is set to a value larger than the value dlmax corresponding to the upper limit voltage of the overlap region OV. The voltage of the drive signal COM rises in a period from time t1 to time t4, and the voltage of the drive signal COM decreases in a period from time t5 to time t8. The counter pulse CP is output in a period from time t2 to time t3 and a period from time t6 to time t7. The period from time t2 to time t3 in which the counter pulse CP is output is included in the period from time t1 to time t4 in which the voltage of the drive signal COM rises. Moreover, the period from time t6 to time t7 in which the counter pulse CP is output is included in the period from time t5 to time t8 in which the voltage of the drive signal COM decreases. Thus, the signal waveform of the drive signal COM is hardly distorted.

As described above, since the first threshold dvth1 and the second threshold dvth2 can be set independently of each other, it is easy to set the first threshold dvth1 and the second threshold dvth2 such that the counter pulse CP is output only in the period in which the voltage of the drive signal COM rises and the period in which the voltage of the drive signal decreases in consideration of the delay time duration of the drive signal COM.

As described above, the voltage vhv2−vf×N that is the lower limit voltage of the overlap region OV is the power supply voltage supplied to the drain terminal which is one end of the transistor M3. Thus, as in the example of FIG. 10, it is preferable that the first threshold dvth1 is set to the value smaller than the value dhmin corresponding to the lower limit voltage of the overlap region OV. As a result, when the level switching signal LS is switched from the L level to the H level, the voltage of the drive signal COM is lower than the voltage vhv2−vf×N which is the power supply voltage supplied to the drain terminal which is one end of the transistor M3. Thus, a timing at which the output of the counter pulse CP starts is earlier, the output of the counter pulse CP is completed in the period in which the voltage of the drive signal COM rises, and the signal waveform of the drive signal COM is hardly distorted.

Moreover, as described above, the voltage vhv1, which is the upper limit voltage of the overlap region OV, is the power supply voltage supplied to the drain terminal which is one end of the transistor M1. Thus, as in the example of FIG. 10, it is preferable that the second threshold dvth2 is set to the value larger than the value dlmax corresponding to the upper limit voltage of the overlap region OV. As a result, when the level switching signal LS is switched from the H level to the L level, the voltage of the drive signal COM is higher than the voltage vhv1 which is the power supply voltage supplied to the drain terminal which is one end of the transistor M1. Thus, a timing at which the output of the counter pulse CP starts is earlier, the output of the counter pulse CP is completed in the period in which the voltage of the drive signal COM decreases, and the signal waveform of the drive signal COM is hardly distorted.

In addition, in the first embodiment, the ejecting section 600 including the piezoelectric element 60 is an example of a "drive section". Moreover, the potential having the L level of the level switching signal LS is an example of a "first potential", and the potential having the H level of the level switching signal LS is an example of a "second potential".

1-4. Actions and Effects

As described above, in the liquid ejecting apparatus 1 of the first embodiment, in the drive circuit 50, the first threshold dvth1 for switching the level switching signal LS from the L level to the H level and the second threshold dvth2 for switching the level switching signal from the H level to the L level can be set independently of each other. Thus, in consideration of the delay time duration of the drive signal COM, it is easy to set the first threshold dvth1 such that the level switching signal LS is switched from the L level to the H level in the period in which the voltage of the drive signal COM rises and set the second threshold dvth2 such that the level switching signal LS is switched from the H level to the L level in the period in which the voltage of the drive signal COM decreases. Accordingly, according to the liquid ejecting apparatus 1 of the first embodiment, in the drive circuit 50, since a possibility that a timing at which the potential of the level switching signal LS is switched is deviated and the waveform of the drive signal COM is distorted is reduced, the waveform accuracy of the drive signal COM can be improved.

Moreover, in the liquid ejecting apparatus 1 of the first embodiment, in the drive circuit 50, the level switching signal generation circuit 710 switches the level switching signal LS from the L level to the H level, and then outputs the counter pulse CP in order to reduce the waveform distortion of the drive signal COM caused by this switching. Moreover, the level switching signal generation circuit 710 switches the level switching signal LS from the H level to the L level, and then outputs the counter pulse CP in order to reduce the waveform distortion of the drive signal COM caused by this switching. When the counter pulse CP is output in the period in which the voltage of the drive signal COM is constant, the waveform of the drive signal COM may be distorted by the counter pulse CP. On the other hand, according to the liquid ejecting apparatus 1 of the first embodiment, in the drive circuit 50, since it is easy to set the first threshold dvth1 and the second threshold dvth2 such that the counter pulse CP is output in the period in which the voltage of the drive signal COM rises and the period in which the voltage of the drive signal COM decreases, the waveform distortion of the drive signal COM is reduced, and the waveform accuracy of the drive signal COM can be improved.

Moreover, in the liquid ejecting apparatus 1 of the first embodiment, in the drive circuit 50, when the voltage of the drive signal COM is lower than the voltage vhv2−vf×N which is the power supply voltage supplied to the transistor M3, that is, at an early timing within the period in which the voltage of the drive signal COM rises, the level switching signal LS is switched from the L level to the H level. Accordingly, according to the liquid ejecting apparatus 1 of the first embodiment, in the drive circuit 50, since a time duration from when the level switching signal LS is switched from the L level to the H level to when the voltage of the drive signal COM is constant can be lengthened, the waveform distortion of the drive signal COM caused by switching the level switching signal LS from the L level to the H level is reduced. When the counter pulse CP is output in the period in which the voltage of the drive signal COM is constant, the waveform of the drive signal COM may be distorted by the counter pulse CP. On the other hand, in the liquid ejecting apparatus 1 of the first embodiment, in the drive circuit 50, since the time duration from when the level switching signal LS is switched from the L level to the H level to when the voltage of the drive signal COM is constant can be lengthened, it is easy to output the counter pulse CP in the period in which the voltage of the drive signal COM rises. Accordingly, according to the liquid ejecting apparatus 1 of the first embodiment, the waveform distortion of the drive signal COM output by the drive circuit 50 is reduced, and the waveform accuracy of the drive signal COM can be improved.

Moreover, in the liquid ejecting apparatus 1 of the first embodiment, in the drive circuit 50, when the voltage of the drive signal COM is higher than the voltage vhv1 which is the power supply voltage supplied to the transistor M1, that is, at an early timing within the period in which the voltage of the drive signal COM decreases, the level switching signal LS is switched from the H level to the L level. Accordingly, according to the liquid ejecting apparatus 1 of the first embodiment, in the drive circuit 50, since a time duration from when the level switching signal LS is switched from the H level to the L level to when the voltage of the drive signal COM is constant can be lengthened, the waveform distortion of the drive signal COM caused by switching the level switching signal LS from the H level to the L level is reduced. When the counter pulse CP is output in the period in which the voltage of the drive signal COM is constant, the waveform of the drive signal COM may be distorted by the counter pulse CP. On the other hand, in the liquid ejecting apparatus 1 of the first embodiment, in the drive circuit 50, since the time duration from when the level switching signal LS is switched from the H level to the L level to when the voltage of the drive signal COM is constant can be lengthened, it is easy to output the counter pulse CP in the period in which the voltage of the drive signal COM decreases. Accordingly, according to the liquid ejecting apparatus 1 of the first embodiment, the waveform distortion of the drive signal COM output by the drive circuit 50 is reduced, and the waveform accuracy of the drive signal COM can be improved.

2. Second Embodiment

Hereinafter, components of a second embodiment similar to the first embodiment will be given the same reference numerals, the description overlapping with the first embodiment will be omitted or simplified, and contents different from the first embodiment will be mainly described.

Since a functional configuration of a drive circuit 50 included in a liquid ejecting apparatus 1 of the second embodiment is similar to FIG. 6, the illustration and description thereof will be omitted. However, in the second embodiment, a function of a level switching signal generation circuit 710 is different from the first embodiment.

As described above, when the level switching signal LS is at the L level, the transistor M3 is unenergized, and the transistor M4 is energized. At this time, when the modulation signal MS changes from the L level to the H level, the transistor M1 is energized, and the transistor M2 is unenergized. Thus, the voltage of the first amplified modulation signal AMS1 changes from the ground potential to the voltage vhv1. The current for storing the charges in the capacitor 562 of the demodulation circuit 560 flows through the transistor M1, the first output point OP1, the transistor M4, and the second output point OP2. Moreover, when the level switching signal LS is at the L level and when the modulation signal MS changes from the H level to the L level, the transistor M1 is unenergized, and the transistor M2 is energized. Thus, the voltage of the first amplified modulation signal AMS1 changes from the voltage vhv1 to the ground potential. The current for releasing the charges stored in the capacitor 562 flows through the second output point OP2, the transistor M4, the first output point OP1, and the transistor M2.

On the other hand, when the level switching signal LS is at the H level, the transistor M3 is energized, and the transistor M4 is unenergized. At this time, when the modulation signal MS changes from the L level to the H level, the transistor M1 is energized, and the transistor M2 is unenergized. Thus, the voltage of the first amplified modulation signal AMS1 changes from the ground potential to the voltage vhv1. Then, the current for storing the charges in the capacitor 562 flows through the transistor M1, the first output point OP1, the transistor M3, and the second output point OP2. Moreover, when the level switching signal LS is at the H level and when the modulation signal MS changes from the H level to the L level, the transistor M1 is unenergized, and the transistor M2 is energized. Thus, the voltage of the first amplified modulation signal AMS1 changes from the voltage vhv1 to the ground potential. The current for releasing the charges stored in the capacitor 562 flows through the second output point OP2, the transistor M3, the first output point OP1, and the transistor M2.

As described above, regardless of whether the level switching signal LS is at the L level or the H level, since the current flowing through the second output point OP2 increases or decreases whenever the logic level of the modulation signal MS changes, the current becomes a ripple current. Due to this ripple current, a ripple voltage $V_{rpl}$ is generated in the drive signal COM.

Figure 11:
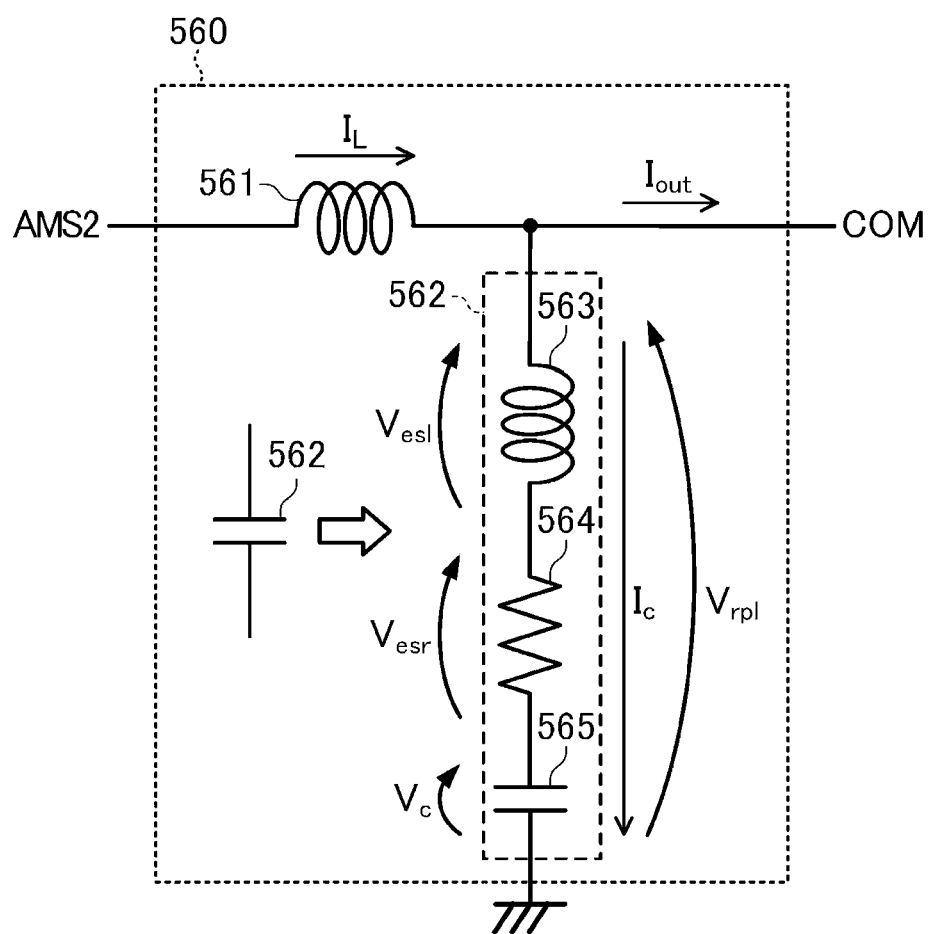
FIG. 11 is a diagram illustrating an equivalent circuit of a demodulation circuit.
Figure 12:
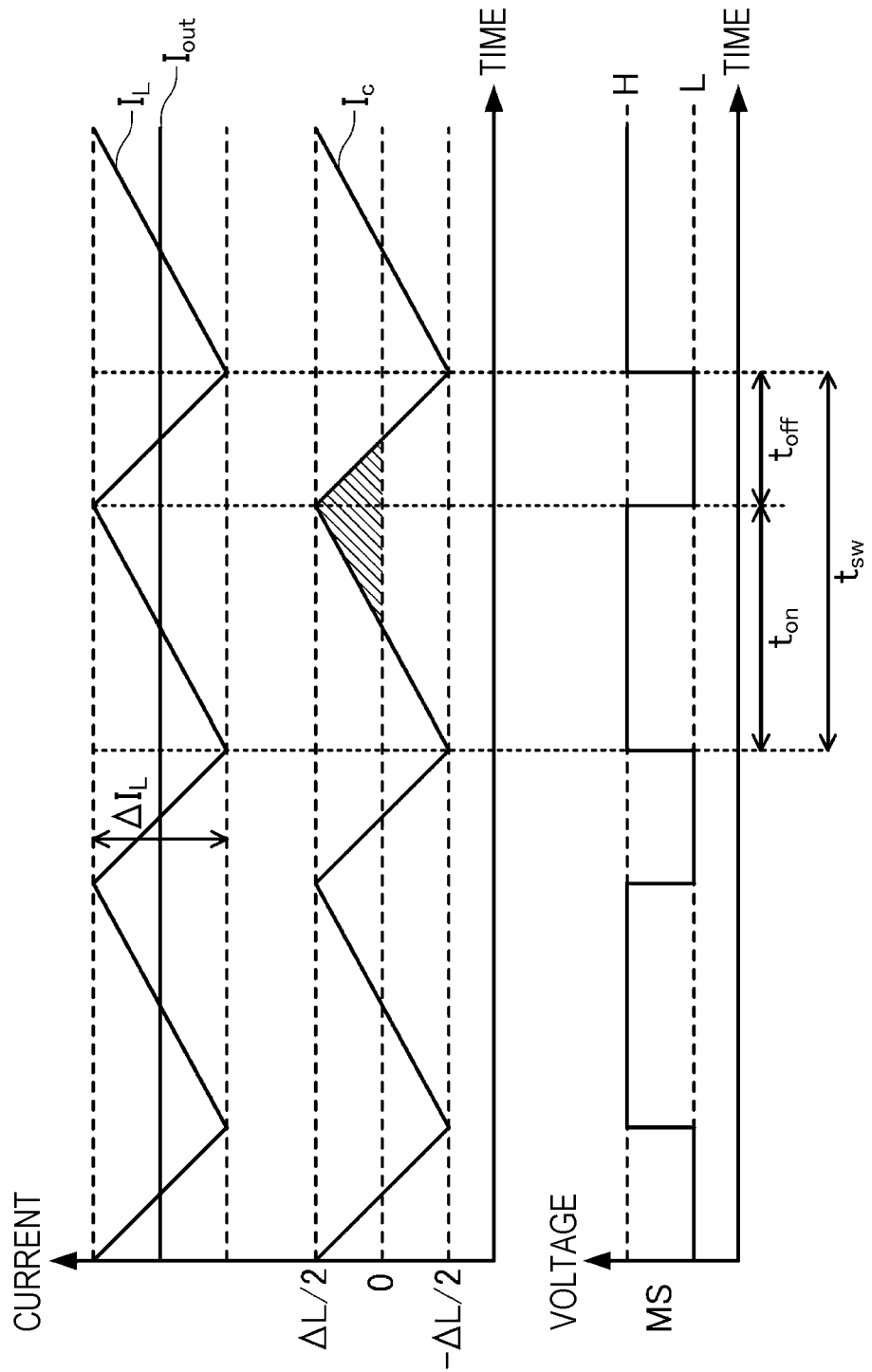
FIG. 12 is a diagram illustrating an example of each current in FIG. 11.

As illustrated in FIG. 11, the capacitor 562 of the demodulation circuit 560 is replaced with an inductor 563, a resistor 564, and a capacitor 565 which are coupled in series. A current $I_L$ flowing through the inductor 561 of the demodulation circuit 560 is a sum of a current $I_c$ flowing through the inductor 563, the resistor 564, and the capacitor 565 that correspond to the capacitor 562 and a current $I_{out}$ flowing from the demodulation circuit 560 to the piezoelectric element 60. FIG. 12 illustrates an example of the current $I_L$, the current $I_c$, and the current $I_{out}$.

As represented in Equation (1), when the current $I_c$ flows through the inductor 563, the resistor 564, and the capacitor 565, the ripple voltage $V_{rpl}$ is defined as a voltage $V_c$ at both ends of the capacitor 565, a voltage $V_{esr}$ at both ends of the resistor 564, and a voltage $V_{esl}$ at both ends of the inductor 563.

$$V_{rpl} = V_c + V_{esr} + V_{esl} \tag{1}$$

A relationship between a capacitance value C of the capacitor 565, the voltage $V_c$, and a charge amount Q is represented in Equation (2).

$$Q = CV_C \tag{2}$$

Moreover, since the charge amount Q is equal to an area of a diagonally shaded portion in FIG. 12, the charge amount Q is represented in Equation (3).

$$Q = \frac{1}{2} \cdot \frac{t_{sw}}{2} \cdot \frac{\Delta I_L}{2} = \frac{1}{8} \cdot \frac{\Delta I_L}{f_{sw}} \tag{3}$$

Accordingly, from Equation (2) and Equation (3), the voltage $V_c$ of the capacitor 565 is represented in Equation (4).

$$V_C = \frac{\Delta I_L}{8 \cdot C \cdot f_{sw}} \tag{4}$$

A relationship between an inductance value $L_{esl}$, the voltage $V_{esl}$, and the current $I_c$ of the inductor 563 is represented in Equation (5). As illustrated in FIG. 12, in Equation (5), $t_{on}$ is a time duration in which the modulation signal MS is at the H level, and $t_{off}$ is a time duration in which the modulation signal MS is at the L level. Moreover, $f_{sw}$ is a switching frequency of the transistors M1 and M2, and is a reciprocal of a time duration $t_{sw}$ of one cycle of the modulation signal MS illustrated in FIG. 12.

$$V_{esl} = L_{esl} \cdot \frac{dI_c}{dt} = L_{esl} \cdot \Delta I_L \cdot \left( \frac{1}{t_{on}} + \frac{1}{T_{off}} \right) = L_{esl} \cdot \Delta I_L \frac{f_{sw}}{D \cdot (1-D)} \tag{5}$$

Moreover, D is a ratio between the output voltage $V_{out}$ and an input voltage $V_{in}$ of the demodulation circuit 560, and is represented in Equation (6).

$$D = \frac{V_{out}}{V_{in}} \tag{6}$$

Moreover, $\Delta I_L$ is an amplitude of the current $I_L$, and is represented in Equation (7). In Equation (7), L is an inductance value of the inductor 561.

$$\Delta I_L = \frac{(V_{in} - V_{out}) \cdot V_{out}}{L \cdot f_{sw} \cdot V_{in}} \tag{7}$$

Accordingly, Equation (6) and Equation (7) are substituted into Equation (5), and the voltage $V_{esl}$ of the inductor 563 is represented in Equation (8).

$$V_{esl} = L_{esl} \cdot \frac{V_{in}}{L} \tag{8}$$

A relationship between a resistor value $R_{esr}$ and the voltage $V_{esr}$ of the resistor 564 and $\Delta I_L$ of the current $I_L$ is represented in Equation (9).

$$V_{esr} = R_{esr} \cdot \Delta I_L \tag{9}$$

Accordingly, Equation (4), Equation (8), and Equation (9) are substituted into Equation (1), and the ripple voltage $V_{rpl}$ is represented in Equation (10). From Equation (10), it can be seen that the lower the switching frequency $f_{sw}$, the higher the ripple voltage $V_{rpl}$.

$$V_{rpl} = \Delta I_L \cdot \left( \frac{1}{8 \cdot C \cdot f_{sw}} + R_{esr} \right) + L_{esl} \cdot \frac{V_{in}}{L} \tag{10}$$

Figure 13:
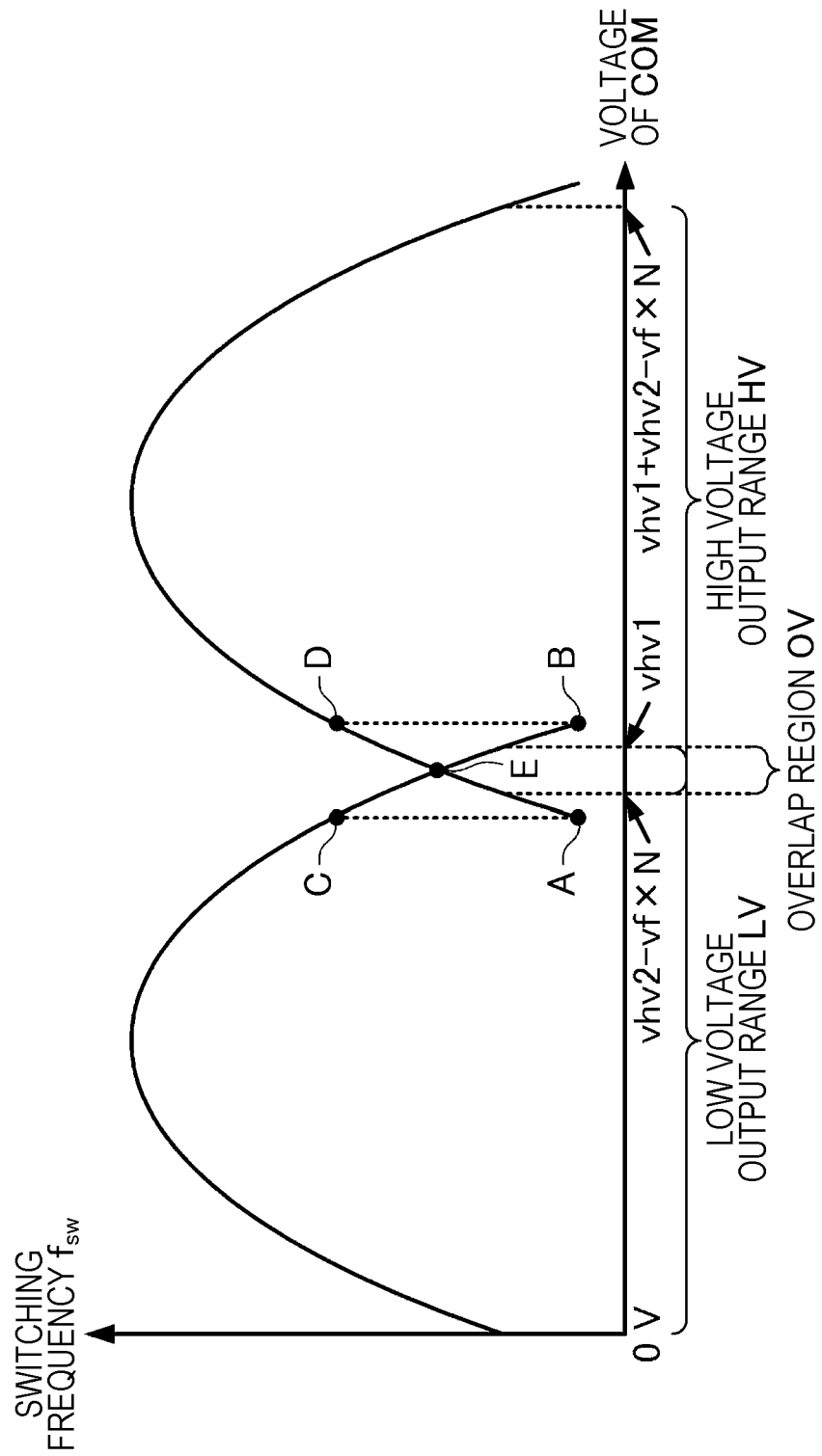
FIG. 13 is a diagram illustrating a relationship between a voltage of the drive signal and a switching frequency.

A relationship between the voltage of the drive signal COM and the switching frequency $f_{sw}$ is as illustrated in FIG. 13. As illustrated in FIG. 13, the relationship between the voltage of the drive signal COM and the switching frequency $f_{sw}$ is indicated by a parabola on a left side when the level switching signal LS is at the L level, and is indicated by a parabola on a right side when the level switching signal LS is at the H level. Accordingly, as the voltage of the drive signal COM is away from a center of the low voltage output range LV, the switching frequency $f_{sw}$ decreases. Similarly, as the voltage of the drive signal COM is away from a center of the high voltage output range HV, the switching frequency $f_{sw}$ decreases. Thus, in the drive circuit 50 according to the first embodiment, depending on a relationship between the waveform of the base drive signal dA and the first threshold dvth1, the voltage of the drive signal COM is constant in a state where the switching frequency $f_{sw}$ is low, and ripple superimposed in the period in which the voltage of the drive signal COM is constant increases. Thus, there is a possibility that the waveform accuracy of the drive signal COM deteriorates.

FIGS. 14 and 15 illustrate an example in which the waveform of the drive signal COM deteriorates. In FIGS. 14 and 15, for the sake of convenience in illustration and description, the waveform of the drive signal COM is illustrated as having no delay.

In the example of FIG. 14, the first threshold dvth1 is set to a value smaller than the value dhmin corresponding to the voltage vhv2−vf×N which is the lower limit voltage of the high voltage output range HV. In a period from time t1 to time t3, the value of the base drive signal dA increases. At time t2, the value of the base drive signal dA becomes larger than the first threshold dvth1, and the level switching signal LS is switched from the L level to the H level. In a subsequent period from time t3 to time t4, the value of the base drive signal dA is a constant value smaller than dhmin, and the voltage of the drive signal COM is a constant voltage smaller than the voltage vhv2−vf×N which is the lower limit voltage of the high voltage output range HV. In the period from time t3 to time t4, the relationship between the voltage of the drive signal COM and the switching frequency $f_{sw}$ is indicated by a point A in FIG. 13. Since the switching frequency $f_{sw}$ is very low, large ripple is generated in the drive signal COM as illustrated in FIG. 14.

Moreover, in the example of FIG. 15, the first threshold dvth1 is set to the value smaller than the value dhmin corresponding to the voltage vhv2−vf×N which is the lower limit voltage of the high voltage output range HV, and the second threshold dvth2 is set to a value larger than the value dlmax corresponding to the voltage vhv1 which is the upper limit voltage of the low voltage output range LV. In a period from time t1 to time t3, the value of the base drive signal dA increases. At time t2, the value of the base drive signal dA becomes larger than the first threshold dvth1, and the level switching signal LS is switched from the L level to the H level. In the subsequent period from time t3 to time t4, the value of the base drive signal dA is a constant value larger than the second threshold dvth2, and the voltage of the drive signal COM is also a constant voltage. In a subsequent period from time t4 to time t6, the value of the base drive signal dA decreases. At time t5, the value of the base drive signal dA becomes smaller than the second threshold dvth2, and the level switching signal LS is switched from the H level to the L level. In a subsequent period after time t6, the value of the base drive signal dA is a constant value larger than dlmax, and the voltage of the drive signal COM is a constant voltage higher than the voltage vhv1 which is the upper limit voltage of the low voltage output range LV. In the period after time t6, the relationship between the voltage of the drive signal COM and the switching frequency $f_{sw}$ is indicated by a point B in FIG. 13. Since the switching frequency $f_{sw}$ is very low, large ripple is generated in the drive signal COM as illustrated in FIG. 15.

Therefore, in the second embodiment, when the value of the base drive signal dA increases from a first value smaller than the first threshold dvth1 to a second value larger than the first threshold dvth1 in a first period T1 and is constant at the second value in a second period T2 subsequently to the first period T1, in a case where the second value is smaller than a third threshold dvth3, the level switching signal generation circuit 710 retains the potential of the level switching signal LS at the L level in the first period T1 and the second period T2. As a result, in the first period T1 and the second period T2, the transistor M3 is unenergized, and the transistor M4 is energized.

Moreover, when the value of the base drive signal dA increases from the first value smaller than the first threshold dvth1 to the second value larger than the first threshold dvth1 in the first period T1 and is constant at the second value in the second period T2 subsequently to the first period T1, in a case where the second value is larger than the third threshold dvth3, as in the first embodiment, the level switching signal generation circuit 710 switches the level switching signal LS from the L level to the H level when the value of the base drive signal dA becomes larger than the first threshold dvth1 in the first period T1, and retains the potential of the level switching signal LS at the H level in the second period T2. As a result, in the second period T2, the transistor M3 is energized, and the transistor M4 is unenergized.

Here, when the value of the base drive signal dA is smaller than the value dhmin corresponding to the voltage vhv2−vf×N which is the lower limit voltage of the high voltage output range HV, in a case where the level switching signal LS is at the H level, since the voltage of the drive signal COM is lower than the voltage vhv2−vf×N which is the lower limit voltage that can be output by the level shift circuit 750, there is a possibility that the waveform of the drive signal COM is distorted. Here, when the value of the base drive signal dA is larger than the value dlmax corresponding to the voltage vhv1 which is the upper limit voltage of the low voltage output range LV, in a case where the level switching signal LS is at the L level, since the voltage of the drive signal COM is higher than the voltage vhv1 which is the upper limit voltage that can be output by the amplification circuit 550, there is a possibility that the waveform of the drive signal COM is distorted. Accordingly, the third threshold dvth3 is set to be equal to or larger than dhmin and equal to or smaller than dlmax. For example, the third threshold dvth3 may be the value dhmin corresponding to the voltage vhv2−vf×N which is the lower limit voltage of the high voltage output range HV.

FIG. 16 illustrates an example of waveforms of the base drive signal dA, the level switching signal LS, and the drive signal COM according to the second embodiment. In FIG. 16, for the sake of convenience in illustration and description, the waveform of the drive signal COM is illustrated as having no delay.

In the example of FIG. 16, the first threshold dvth1 is set to a value smaller than the value dhmin corresponding to the voltage vhv2−vf×N which is the lower limit voltage of the high voltage output range HV. Moreover, the third threshold dvth3 is set to dhmin. The value of the base drive signal dA increases from the first value smaller than the first threshold dvth1 to the second value larger than the first threshold dvth1 in the first period T1 from time t1 to time t3, and is constant at the second value in the second period T2 from time t3 to time t4 subsequently to the first period T1. At time t2, although the value of the base drive signal dA becomes larger than the first threshold dvth1, since the second value is smaller than the third threshold dvth3, the level switching signal generation circuit 710 retains the potential of the level switching signal LS at the L level in the first period T1 and the second period T2. In the second period T2 from time t3 to time t4, the relationship between the voltage of the drive signal COM and the switching frequency $f_{sw}$ is indicated by a point C in FIG. 13. Since the switching frequency $f_{sw}$ at the point C in FIG. 13 is higher than at the point A, the ripple of the drive signal COM is further reduced than in FIG. 14 as illustrated in FIG. 16.

Moreover, in the second embodiment, when the value of the base drive signal dA decreases from a third value larger than the second threshold dvth2 to a fourth value smaller than the second threshold dvth2 in a third period T3 and is constant at the fourth value in a fourth period T4 subsequently to the third period T3, in a case where the fourth value is larger than a fourth threshold dvth4, the level switching signal generation circuit 710 retains the potential of the level switching signal LS at the H level in the third period T3 and the fourth period T4. As a result, in the third period T3 and the fourth period T4, the transistor M3 is energized, and the transistor M4 is unenergized.

Moreover, when the value of the base drive signal dA decreases from the third value larger than the second threshold dvth2 to the fourth value smaller than the second threshold dvth2 in the third period T3 and is constant at the fourth value in the fourth period T4 subsequently to the third period T3, in a case where the fourth value is smaller than the fourth threshold dvth4, as in the first embodiment, the level switching signal generation circuit 710 switches the level switching signal LS from the H level to the L level when the value of the base drive signal dA becomes smaller than the fourth threshold dvth4 in the third period T3, and retains the potential of the level switching signal LS at the L level in the fourth period T4. As a result, in the fourth period T4, the transistor M3 is unenergized, and the transistor M4 is energized.

As described above, here, the level switching signal LS is at the H level when the value of the base drive signal dA is smaller than dhmin, or the level switching signal LS is at the L level when the value of the base drive signal dA is larger than dlmax, and there is a possibility that the waveform of the drive signal COM is distorted. Accordingly, the fourth threshold dvth4 is set to be equal to or larger than dhmin and equal to or smaller than dlmax. For example, the fourth threshold dvth4 may be the value dlmax corresponding to the voltage vhv1 which is the upper limit voltage of the low voltage output range LV.

FIG. 17 illustrates an example of waveforms of the base drive signal dA, the level switching signal LS, and the drive signal COM according to the second embodiment. In FIG. 17, for the sake of convenience in illustration and description, the waveform of the drive signal COM is illustrated as having no delay.

In the example of FIG. 17, the first threshold dvth1 is set to the value smaller than the value dhmin corresponding to the voltage vhv2−vf×N which is the lower limit voltage of the high voltage output range HV, and the second threshold dvth2 is set to a value larger than the value dlmax corresponding to the voltage vhv1 which is the upper limit voltage of the low voltage output range LV. Moreover, the third threshold dvth3 is set to dhmin, and the fourth threshold dvth4 is set to dlmax. The value of the base drive signal dA increases from the first value smaller than the first threshold dvth1 to the second value larger than the first threshold dvth1 in the first period T1 from time t1 to time t3, and is constant at the second value in the second period T2 from time t3 to time t4 subsequently to the first period T1. At time t2, since the value of the base drive signal dA becomes larger than the first threshold dvth1 and the second value is larger than the third threshold dvth3, the level switching signal LS is switched from the L level to the H level. Moreover, the second value becomes larger than the second threshold dvth2 and the fourth threshold dvth4, and the voltage of the drive signal COM is also a constant voltage in the second period T2. The value of the base drive signal dA decreases from the third value larger than the second threshold dvth2 to the fourth value smaller than the second threshold dvth2 in the third period T3 from time t4 to time t6, and is constant at the fourth value in the fourth period T4 after time t6 subsequently to the third period T3. In addition, in the example of FIG. 17, the third value is the same as the second value. At time t5, although the value of the base drive signal dA becomes smaller than the second threshold dvth2, since the fourth value is larger than the fourth threshold dvth4, the level switching signal generation circuit 710 retains the potential of the level switching signal LS at the H level in the third period T3 and the fourth period T4. In the fourth period T4 after time t6, the relationship between the voltage of the drive signal COM and the switching frequency $f_{sw}$ is indicated by a point D in FIG. 13. Since the switching frequency $f_{sw}$ at the point D in FIG. 13 is higher than at the point B, the ripple of the drive signal COM is further reduced than in FIG. 15 as illustrated in FIG. 17.

Since other functions of the level switching signal generation circuit 710 are similar to the first embodiment, the description thereof will be omitted. Moreover, since other configurations of the liquid ejecting apparatus 1 of the second embodiment are similar to the first embodiment, the description thereof will be omitted.

In the liquid ejecting apparatus 1 of the second embodiment described above, in the drive circuit 50, when the base drive signal dA increases from the first value and is constant at the second value larger than the third threshold dvth3, the voltage of the drive signal COM rises and is constant at a high voltage. In this case, the level switching signal LS is switched from the L level to the H level, and the level shift circuit 750 outputs the signal obtained by shifting the potential of the first amplified modulation signal AMS1. Thus, since the drive signal COM is constant at a voltage within a voltage range that can be output by the level shift circuit 750, overshoot occurred in the drive signal COM is reduced. On the other hand, when the base drive signal dA increases from the first value and is constant at the second value smaller than the third threshold dvth3, the voltage of the drive signal COM rises and is constant at a low voltage. In this case, when the level switching signal LS is switched from the L level to the H level, since the level shift circuit 750 outputs the signal obtained by shifting the potential of the first amplified modulation signal AMS1, the drive signal COM is constant at a voltage outside the voltage range that can be output by the level shift circuit 750. Thus, the overshoot occurred in the drive signal COM increases. On the other hand, in the liquid ejecting apparatus 1 of the second embodiment, in the drive circuit 50, when the base drive signal dA increases from the first value and is constant at the second value smaller than the third threshold dvth3, since the level switching signal LS is retained at the L level, the level shift circuit 750 outputs the first amplified modulation signal AMS1. Thus, since the drive signal COM is constant at a voltage within a voltage range that can be output by the level shift circuit 750, overshoot occurred in the drive signal COM is reduced. Accordingly, according to the liquid ejecting apparatus 1 of the second embodiment, the overshoot of the drive signal COM output by the drive circuit 50 is reduced, and the waveform accuracy of the drive signal COM can be improved.

Moreover, in the liquid ejecting apparatus 1 of the second embodiment described above, in the drive circuit 50, when the base drive signal dA decreases from the third value and is constant at the fourth value smaller than the fourth threshold dvth4, the voltage of the drive signal COM decreases and is constant at a low voltage. In this case, the level switching signal LS is switched from the H level to the L level, and the level shift circuit 750 outputs the first amplified modulation signal AMS1. Thus, since the drive signal COM is constant at the voltage within the voltage range that can be output by the level shift circuit 750, undershoot occurred in the drive signal COM is reduced. On the other hand, when the base drive signal dA decreases from the third value and is constant at the fourth value larger than the fourth threshold dvth4, the voltage of the drive signal COM is constant at a high voltage. In this case, when the level switching signal LS is switched from the H level to the L level, since the level shift circuit 750 outputs the first amplified modulation signal AMS1, the drive signal COM is constant at the voltage outside the voltage range that can be output by the level shift circuit 750. Thus, the undershoot occurred in the drive signal COM increases. On the other hand, in the liquid ejecting apparatus 1 of the second embodiment, in the drive circuit 50, when the base drive signal dA decreases from the third value and is constant at the fourth value larger than the fourth threshold dvt4, since the level switching signal LS is retained at the H level, the level shift circuit 750 outputs the signal obtained by shifting the potential of the first amplified modulation signal AMS1. Thus, since the drive signal COM is constant at the voltage within the voltage range that can be output by the level shift circuit 750, undershoot occurred in the drive signal COM is reduced. Accordingly, according to the liquid ejecting apparatus 1 of the second embodiment, the undershoot of the drive signal COM output by the drive circuit 50 is reduced, and the waveform accuracy of the drive signal COM can be improved.

3. Third Embodiment

Hereinafter, components of a third embodiment similar to the first embodiment or the second embodiment will be given the same reference numerals, the description overlapping with the first embodiment or the second embodiment will be omitted or simplified, and contents different from the first embodiment and the second embodiment will be mainly described.

Since a functional configuration of a drive circuit 50 included in a liquid ejecting apparatus 1 of the third embodiment is similar to FIG. 6, the illustration and description thereof will be omitted. However, in the third embodiment, a function of a level switching signal generation circuit 710 is different from the first embodiment and the second embodiment.

The function of the level switching signal generation circuit 710 according to the third embodiment is basically similar to the second embodiment. However, in the second embodiment, when the value of the base drive signal dA increases and is constant at a value smaller than the third threshold dvth3, even though the value of the base drive signal dA becomes larger than the first threshold dvth1, since the level switching signal LS is retained at the L level, the level switching signal LS is not switched to the H level unless the value of the base drive signal dA becomes smaller than the first threshold dvth1 and then becomes larger than the first threshold dvth1. Similarly, in the second embodiment, when the value of the base drive signal dA decreases and is constant at a value larger than the fourth threshold dvth4, even though the value of the base drive signal dA becomes smaller than the second threshold dvth2, since the level switching signal LS is retained at the H level, the level switching signal LS is not switched to the L level unless the value of the base drive signal dA becomes larger than the second threshold dvth2 and then becomes smaller than the second threshold dvth2.

Therefore, in the third embodiment, when the level switching signal LS is at the L level, in a case where the value of the base drive signal dA increases and becomes larger than a fifth threshold dvth5 equal to or larger than the third threshold dvth3, the level switching signal generation circuit 710 switches the level switching signal LS from the L level to the H level. The fifth threshold dvth5 may be a value which is equal to or larger than the value dhmin corresponding to the voltage vhv2−vf×N which is the lower limit voltage of the high voltage output range HV and is equal to or smaller than the value dlmax corresponding to the voltage vhv1 which is the upper limit voltage of the low voltage output range LV. For example, the fifth threshold dvth5 may be an intermediate value dvct between dhmin and dlmax.

Moreover, in the third embodiment, when the level switching signal LS is at the H level, in a case where the value of the base drive signal dA decreases and becomes smaller than a sixth threshold dvth6 equal to or smaller than the fourth threshold dvth4, the level switching signal generation circuit 710 switches the level switching signal LS from the H level to the L level. The sixth threshold dvth6 may be a value which is equal to or larger than the value dhmin corresponding to the voltage vhv2−vf×N which is the lower limit voltage of the high voltage output range HV and is equal to or smaller than the value dlmax corresponding to the voltage vhv1 which is the upper limit voltage of the low voltage output range LV. For example, the sixth threshold dvth6 may be an intermediate value dvct between dhmin and dlmax. The fifth threshold dvth5 and the sixth threshold dvth6 may be the same value. For example, the fifth threshold dvth5 and the sixth threshold dvth6 may be dvct.

Figure 18:
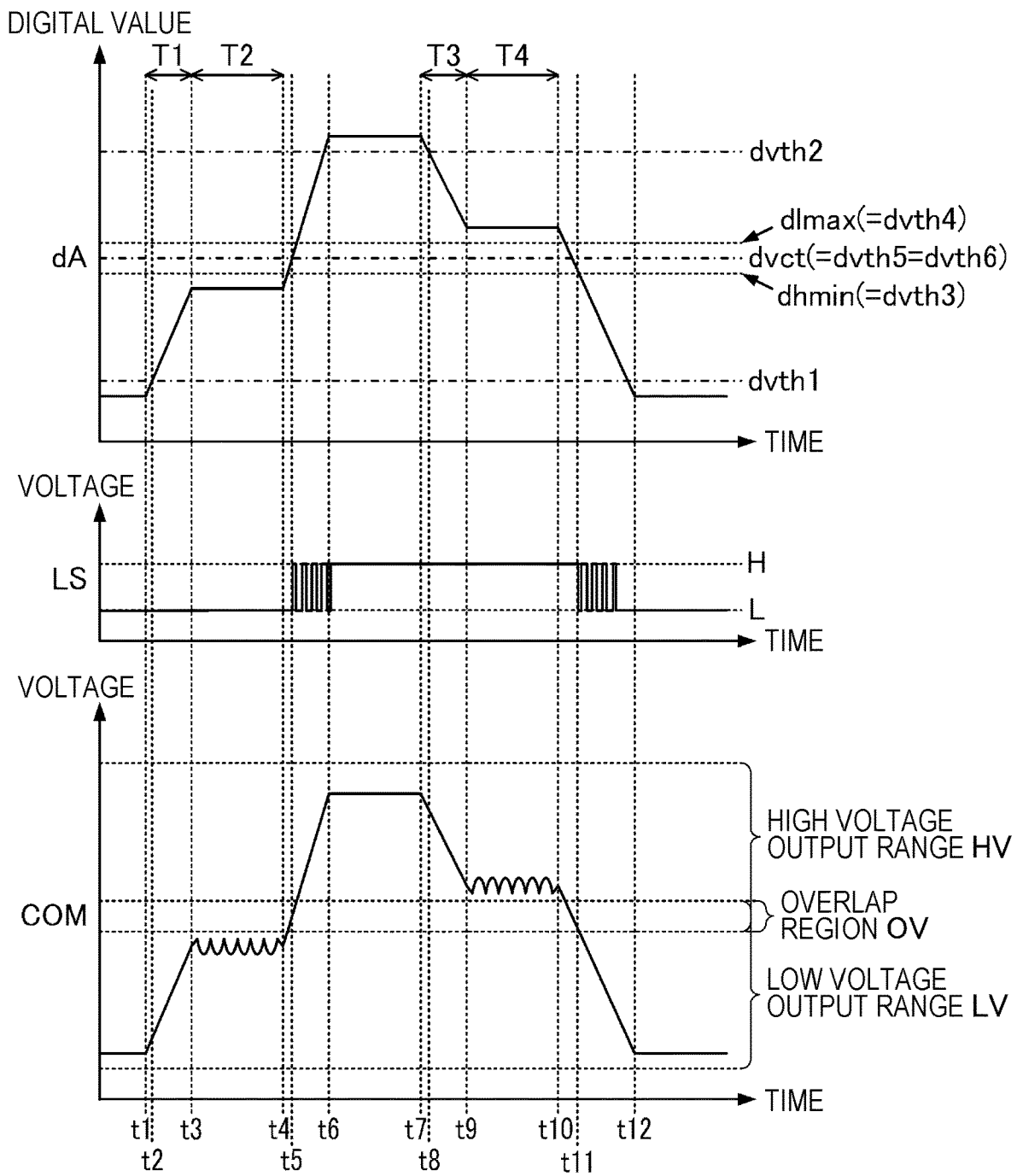
FIG. 18 is a diagram illustrating another example of waveforms of a base drive signal, a level switching signal, and a drive signal according to a third embodiment.

FIG. 18 illustrates an example of waveforms of the base drive signal dA, the level switching signal LS, and the drive signal COM according to the third embodiment. In FIG. 18, for the sake of convenience in illustration and description, the waveform of the drive signal COM is illustrated as having no delay.

In the example of FIG. 18, the first threshold dvth1 is set to the value smaller than the value dhmin corresponding to the voltage vhv2−vf×N which is the lower limit voltage of the high voltage output range HV, and the second threshold dvth2 is set to a value larger than the value dlmax corresponding to the voltage vhv1 which is the upper limit voltage of the low voltage output range LV. Moreover, the third threshold dvth3 is set to dhmin, and the fourth threshold dvth4 is set to dlmax. Further, the fifth threshold dvth5 is set to a value dvct which is the intermediate value between dhmin and dlmax which is equal to or larger than the third threshold dvth3, and the sixth threshold dvth6 is set to a value dvct which is equal to or smaller than the fourth threshold dvth4. That is, the fifth threshold dvth5 and the sixth threshold dvth6 are set to the same value dvct.

The value of the base drive signal dA increases from the first value smaller than the first threshold dvth1 to the second value larger than the first threshold dvth1 in the first period T1 from time t1 to time t3, and is constant at the second value in the second period T2 from time t3 to time t4 subsequently to the first period T1. At time t2, although the value of the base drive signal dA becomes larger than the first threshold dvth1, since the second value is smaller than the third threshold dvth3, the level switching signal generation circuit 710 retains the potential of the level switching signal LS at the L level in the first period T1 and the second period T2.

The value of the base drive signal dA increases from the second value to the third value larger than the second threshold dvth2 in a period from time t4 to time t6, and is constant at the third value in the period from time t6 to time t7. At time t5, since the value of the base drive signal dA becomes larger than the fifth threshold dvth5, the level switching signal generation circuit 710 switches the level switching signal LS from the L level to the H level.

The value of the base drive signal dA decreases from the third value larger than the second threshold dvth2 to the fourth value smaller than the second threshold dvth2 in the third period T3 from time t7 to time t9, and is constant at the fourth value in the fourth period T4 from time t9 to time t10 subsequently to the third period T3. At time t8, although the value of the base drive signal dA becomes smaller than the second threshold dvth2, since the fourth value is larger than the fourth threshold dvth4, the level switching signal generation circuit 710 retains the potential of the level switching signal LS at the H level in the third period T3 and the fourth period T4. The value of the base drive signal dA decreases from the fourth value to a value smaller than the first threshold dvth1 in a period from time t10 to time t12, and is constant in a period after time t12. At time t11, since the value of the base drive signal dA becomes smaller than the sixth threshold dvth6, the level switching signal generation circuit 710 switches the level switching signal LS from the H level to the L level.

In addition, in the second period T2 from time t3 to time t4, the relationship between the voltage of the drive signal COM and the switching frequency $f_{sw}$ corresponds to the point C in FIG. 13. Moreover, at time t5, the relationship between the voltage of the drive signal COM and the switching frequency $f_{sw}$ corresponds to a point E in FIG. 13. In the third period T3 from time t7 to time t9, the relationship between the voltage of the drive signal COM and the switching frequency $f_{sw}$ corresponds to the point D in FIG. 13. Moreover, at time t11, the relationship between the voltage of the drive signal COM and the switching frequency $f_{sw}$ corresponds to a point E in FIG. 13. That is, the relationship between the voltage of the drive signal COM and the switching frequency $f_{sw}$ passes through the point C, the point E, the point D, and the point E in FIG. 13 in order.

Since other functions of the level switching signal generation circuit 710 are similar to the second embodiment, the description thereof will be omitted. Moreover, since other configurations of the liquid ejecting apparatus 1 of the third embodiment are similar to the first embodiment, the description thereof will be omitted.

According to the liquid ejecting apparatus 1 of the third embodiment described above, effects similar to the liquid ejecting apparatus 1 of the second embodiment can be obtained.

Moreover, in the liquid ejecting apparatus 1 of the third embodiment, in the drive circuit 50, when the base drive signal dA increases from the first value smaller than the first threshold dvth1 and is constant at the second value larger than the first threshold dvth1 and smaller than the third threshold dvth3, the level switching signal LS is at the L level. Thereafter, in a case where the value of the base drive signal dA further increases and is constant at a value larger than the fifth threshold dvth5 equal to or larger than the third threshold dvth3, when the level switching signal LS is retained at the L level, since the level shift circuit 750 outputs the first amplified modulation signal AMS1, the drive signal COM is constant at the voltage outside the voltage range that can be output by the level shift circuit 750. Thus, the overshoot occurred in the drive signal COM increases. On the other hand, in the liquid ejecting apparatus 1 of the third embodiment, in the drive circuit 50, when the level switching signal LS is at the L level, in a case where the value of the base drive signal dA becomes larger than the fifth threshold dvth5, the level switching signal LS is switched from the L level to the H level, and the level shift circuit 750 outputs the signal obtained by shifting the potential of the first amplified modulation signal AMS1. Thus, since the drive signal COM is constant at a voltage within a voltage range that can be output by the level shift circuit 750, overshoot occurred in the drive signal COM is reduced. Accordingly, according to the liquid ejecting apparatus 1 of the third embodiment, the overshoot of the drive signal COM output by the drive circuit 50 is reduced, and the waveform accuracy of the drive signal COM can be improved.

Moreover, in the liquid ejecting apparatus 1 of the third embodiment, in the drive circuit 50, when the base drive signal dA decreases from the third value larger than the second threshold dvth2 and is constant at the fourth value smaller than the second threshold dvth2 and larger than the fourth threshold dvth4, the level switching signal LS is at the H level. Thereafter, in a case where the value of the base drive signal dA further decreases and is constant at a value smaller than the sixth threshold dvth6 equal to or smaller than the fourth threshold dvth4, when the level switching signal LS is retained at the H level, since the level shift circuit 750 outputs the signal obtained by shifting the potential of the first amplified modulation signal AMS1, the drive signal COM is constant at the voltage outside the voltage range that can be output by the level shift circuit 750. Thus, the undershoot occurred in the drive signal COM increases. On the other hand, in the liquid ejecting apparatus 1 of the third embodiment, in the drive circuit 50, when the level switching signal LS is at the H level, in a case where the value of the base drive signal dA becomes smaller than the sixth threshold dvth6, the level switching signal LS is switched from the H level to the L level, and the level shift circuit 750 outputs the first amplified modulation signal AMS1. Thus, since the drive signal COM is constant at the voltage within the voltage range that can be output by the level shift circuit 750, undershoot occurred in the drive signal COM is reduced. Accordingly, according to the liquid ejecting apparatus 1 of the third embodiment, the undershoot of the drive signal COM output by the drive circuit 50 is reduced, and the waveform accuracy of the drive signal COM can be improved.

4. Fourth Embodiment

Hereinafter, components of a fourth embodiment similar to any of the first embodiment to the third embodiment will be given the same reference numerals, the description overlapping with any of the first embodiment to the third embodiment will be omitted and simplified, and contents different from any of the first embodiment to the third embodiment will be mainly described.

Since a functional configuration of a drive circuit 50 included in a liquid ejecting apparatus 1 of the fourth embodiment is similar to FIG. 6, the illustration thereof will be omitted.

As described above, all the transistors M1 and M2 included in the amplification circuit 550 and the transistors M3 and M4 included in the level shift circuit 750 are N-channel MOSFETs. Losses of the MOSFETs are classified into two losses of a switching loss and an energization loss. The MOSFET having a small gate total charge amount Qg has a small switching loss, and the MOSFET having a small on-resistance has a small energization loss. In addition, the gate total charge amount Qg is a charge amount required to be poured into the gate electrode in order to energize between a drain and a source of the MOSFET. Moreover, the on-resistance is a resistor value between the drain and the source of the MOSFET when the drain and the source of the MOSFET are energized.

Figure 19:
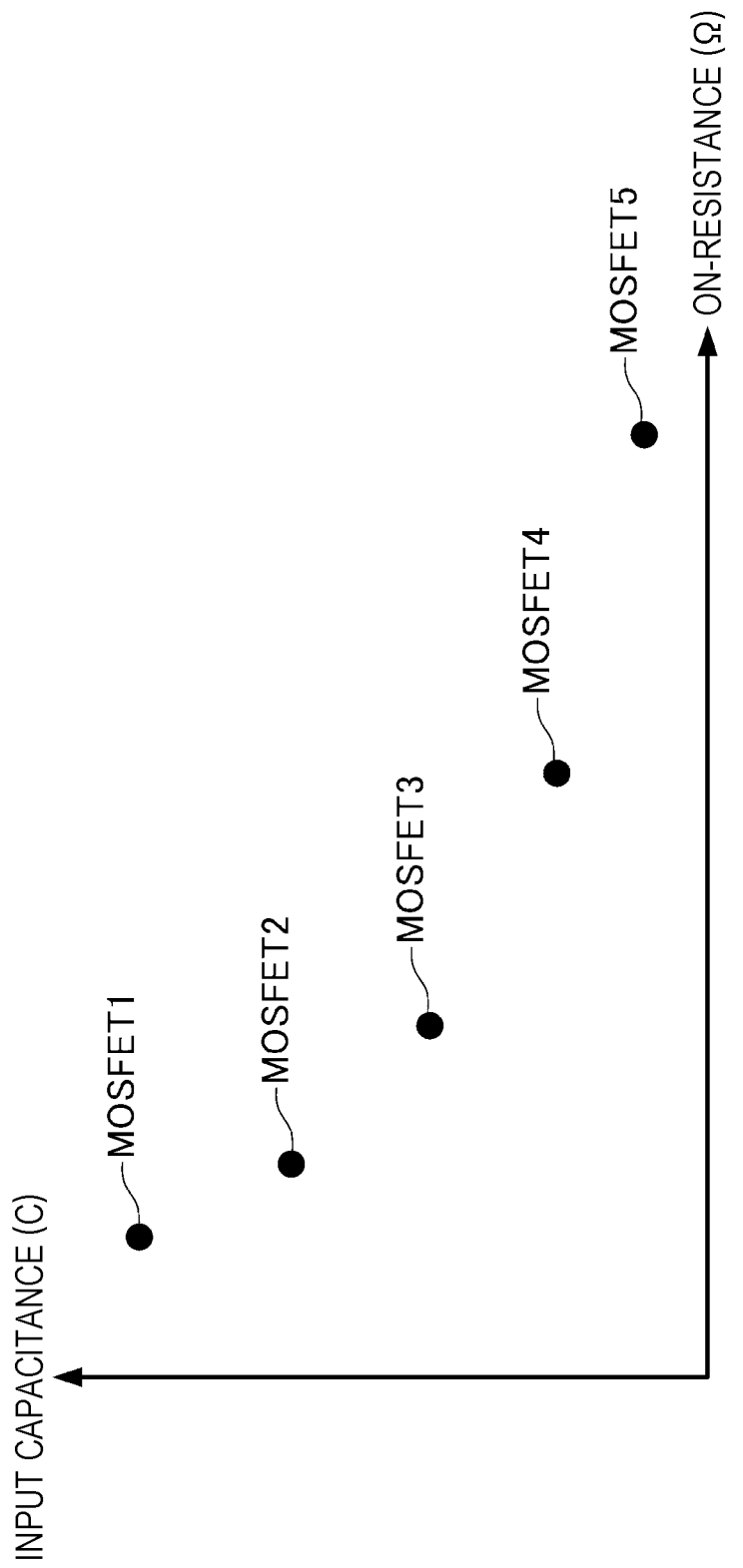
FIG. 19 is a diagram illustrating an example of a relationship between a gate total charge amount and an on-resistance of a MOSFET.

The gate total charge amount Qg and the on-resistance have a trade-off relationship. Thus, the MOSFET having a small gate total charge amount Qg has a small switching loss, but has a large energization loss since the on-resistance is large. Moreover, the MOSFET having a small on-resistance has a small energization loss, but has a large switching loss since the gate total charge amount Qg is large. FIG. 19 illustrates an example of a relationship between the gate total charge amount Qg and the on-resistance of the MOSFET. In the example of FIG. 19, among the five types of MOSFETS, which are MOSFET1 to MOSFET5, the on-resistance is smaller in the order of MOSFET1, MOSFET2, MOSFET3, MOSFET4, and MOSFET5, and the gate total charge amount Qg is smaller in the order of MOSFET5, MOSFET4, MOSFET3, MOSFET2, and MOSFET1.

As described above, the transistors M1 and M2 are frequently repeatedly switched whenever the logic level of the modulation signal MS is switched. Accordingly, the transistors M1 and M2 have a larger switching loss than the energization loss. On the other hand, the transistors M3 and M4 are switched whenever the logic level of the level switching signal LS is switched, but the number of times the logic level of the level switching signal LS is switched is much smaller than the number of times the logic level of the modulation signal MS is switched. Accordingly, the transistors M3 and M4 have a larger energization loss than the switching loss.

Therefore, in the fourth embodiment, the on-resistance of the transistor M1 is larger than the on-resistance of the transistor M3 and the on-resistance of the transistor M4, and the on-resistance of the transistor M2 is larger than the on-resistance of the transistor M3 and the on-resistance of the transistor M4. For example, W/L of the transistors M1 and M2 is set to be smaller than W/L of the transistors M3 and M4, and thus, the on-resistance of the transistors M1 and M2 can be set to be larger than the on-resistance of the transistors M3 and M4. W/L is a ratio of a gate width W to a gate length L. Conversely, the gate total charge amount Qg of the transistor M1 is smaller than the gate total charge amount Qg of the transistor M3 and the gate total charge amount Qg of the transistor M4, and the gate total charge amount Qg of the transistor M2 is smaller than the gate total charge amount Qg of the transistor M3 and the gate total charge amount Qg of the transistor M4. In addition, it is preferable that the transistors M1 and M2 are the same type of MOSFET and the transistors M3 and M4 are the same type of MOSFET. For example, in the example in FIG. 19, when the transistors M1 and M2 are MOSFETn, the transistors M3 and M4 are MOSFE™. Here, n is any integer of 2 or more and 5 or less, and m is any integer smaller than n.

As described above, in the fourth embodiment, since the transistors M1 and M2 are MOSFETs having a large on-resistance and a small gate total charge amount Qg, the switching losses of the transistors M1 and M2 are reduced. Moreover, since the transistors M3 and M4 are MOSFETs having a small on-resistance and a large gate total charge amount Qg, the energization losses of the transistors M3 and M4 are reduced.

Since other configurations of the liquid ejecting apparatus 1 of the fourth embodiment are similar to the first embodiment to the third embodiment, the description thereof will be omitted.

According to the liquid ejecting apparatus 1 of the fourth embodiment described above, effects similar to the liquid ejecting apparatus 1 of the first embodiment to the third embodiment can be obtained.

Further, according to the liquid ejecting apparatus 1 of the fourth embodiment, in the drive circuit 50, since the transistors M1 and M2 having a high frequency of performing the switching operations are MOSFETs having a large on-resistance and a small gate total charge amount Qg, the switching losses of the transistors M1 and M2 are reduced. Moreover, since the transistors M3 and M4 having a low frequency of performing the switching operations are MOSFETS having a small on-resistance and a large gate total charge amount Qg, the energization losses of the transistors M3 and M4 are reduced.

5. Fifth Embodiment

Hereinafter, components of a fifth embodiment similar to any of the first embodiment to the fourth embodiment will be given the same reference numerals, the description overlapping with any of the first embodiment to the fourth embodiment will be omitted and simplified, and contents different from any of the first embodiment to the fourth embodiment will be mainly described.

Figure 20:
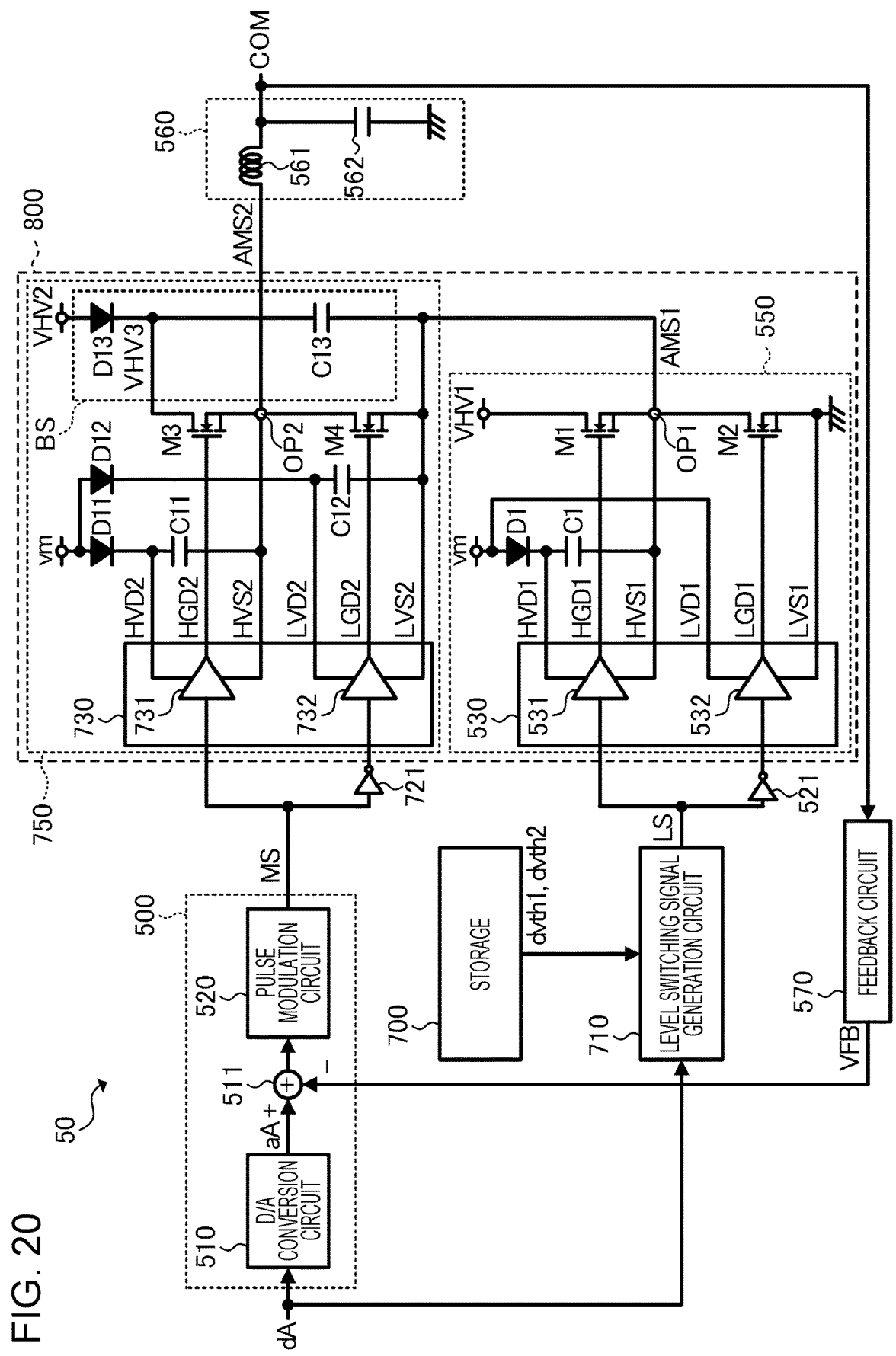
FIG. 20 is a diagram illustrating an example of a functional configuration of a drive circuit according to a fifth embodiment.

FIG. 20 is a diagram illustrating an example of a functional configuration of the drive circuit 50 of the liquid ejecting apparatus 1 of the fifth embodiment. As illustrated in FIG. 20, as in the first embodiment, the drive circuit 50 according to the fifth embodiment includes a D/A conversion circuit 510, an adder 511, a pulse modulation circuit 520, an inverter 521, a demodulation circuit 560, a feedback circuit 570, a level switching signal generation circuit 710, and an amplification level shift circuit 800. Since configurations and functions of the D/A conversion circuit 510, the adder 511, the pulse modulation circuit 520, the inverter 521, the demodulation circuit 560, the feedback circuit 570, and the level switching signal generation circuit 710 are similar to any one of the first embodiment to the fourth embodiment, the description thereof will be omitted. In the fifth embodiment, the configuration of the amplification level shift circuit 800 is different from the first embodiment to the fourth embodiment.

In the fifth embodiment, as in the first embodiment to the fourth embodiment, the amplification level shift circuit 800 includes transistors M1 and M2 switched in response to the modulation signal MS, and transistors M3 and M4 switched in response to the level switching signal LS, outputs an amplified modulation signal obtained by amplifying the modulation signal MS when the level switching signal LS is at the L level, and outputs a signal obtained by shifting the potential of the amplified modulation signal when the level switching signal LS is at the H level.

The amplification level shift circuit 800 includes the amplification circuit 550 and a level shift circuit 750. The amplification circuit 550 outputs a first amplified modulation signal AMS1 that is a signal obtained by amplifying the level switching signal LS by switching operations of the transistors M1 and M2. The first amplified modulation signal AMS1 is a digital signal including a ground potential (0 V) and a voltage vhv1 higher than the ground potential (0 V). By switching operations of the transistors M3 and M4, the level shift circuit 750 outputs, as a second amplified modulation signal AMS2, the amplified modulation signal obtained by amplifying the modulation signal MS when the first amplified modulation signal AMS1 output from the amplification circuit 550 is at the ground potential (0 V), and outputs, as the second amplified modulation signal AMS2, a signal obtained by shifting a potential of the amplified modulation signal obtained by amplifying the modulation signal MS when the first amplified modulation signal AMS1 is at the voltage vhv1.

As illustrated in FIG. 20, a configuration of the amplification circuit 550 according to the fifth embodiment is similar to the amplification circuit 550 according to the first embodiment illustrated in FIG. 6. However, the level shift circuit 750 according to the fifth embodiment is different from the amplification circuit 550 according to the first embodiment in that the level switching signal LS output from the level switching signal generation circuit 710 is input instead of the modulation signal MS output from the modulation circuit 500. Specifically, the level switching signal LS is input to the gate driver 531 included in the gate drive circuit 530, and the gate driver 531 generates the gate signal HGD1 obtained by level-shifting the level switching signal LS and outputs the gate signal HGD1 to the transistor M1. Moreover, the level switching signal LS is input to the gate driver 532 included in the gate drive circuit 530 after the logic level is inverted in the inverter 521, and the gate driver 532 generates the gate signal LGD1 obtained by level-shifting the signal in which the logic level of the level switching signal LS is inverted and outputs the gate signal LGD1 to the transistor M2. The transistor M1 operates based on the gate signal HGD1, and the transistor M2 operates based on the gate signal LGD1. Thus, the first amplified modulation signal AMS1 obtained by amplifying the level switching signal LS with the voltage vhv1 is generated at the first output point OP1.

Moreover, as illustrated in FIG. 20, a configuration of the level shift circuit 750 according to the fifth embodiment is similar to the level shift circuit 750 according to the first embodiment illustrated in FIG. 6. However, the level shift circuit 750 according to the fifth embodiment is different from the level shift circuit 750 according to the first embodiment in that the modulation signal MS output from the modulation circuit 500 is input instead of the level switching signal LS output from the level switching signal generation circuit 710. Specifically, the modulation signal MS is input to a gate driver 731 included in the gate drive circuit 730, and the gate driver 731 generates the gate signal HGD2 obtained by level-shifting the modulation signal MS and outputs the gate signal HGD2 to the transistor M3. Moreover, the modulation signal MS is input to a gate driver 732 included in the gate drive circuit 730 after a logic level is inverted in the inverter 721, and the gate driver 732 generates the gate signal LGD2 obtained by level-shifting the signal in which the logic level of the modulation signal MS is inverted and outputs the gate signal LGD2 to the transistor M4. The transistor M3 operates based on the gate signal HGD2, and the transistor M4 operates based on the gate signal LGD2. Thus, the first amplified modulation signal AMS1 or the signal obtained by shifting the potential of the first amplified modulation signal AMS1 is generated as the second amplified modulation signal AMS2 at the second output point OP2. Specifically, the second amplified modulation signal AMS2 generated at the second output point OP2 is the first amplified modulation signal AMS1 when the first amplified modulation signal AMS1 is at the ground potential (0 V), and is the signal obtained by shifting the potential of the first amplified modulation signal AMS1 by the voltage vhv2−vf×N when the first amplified modulation signal AMS1 is at the voltage vhv1.

Figure 21:
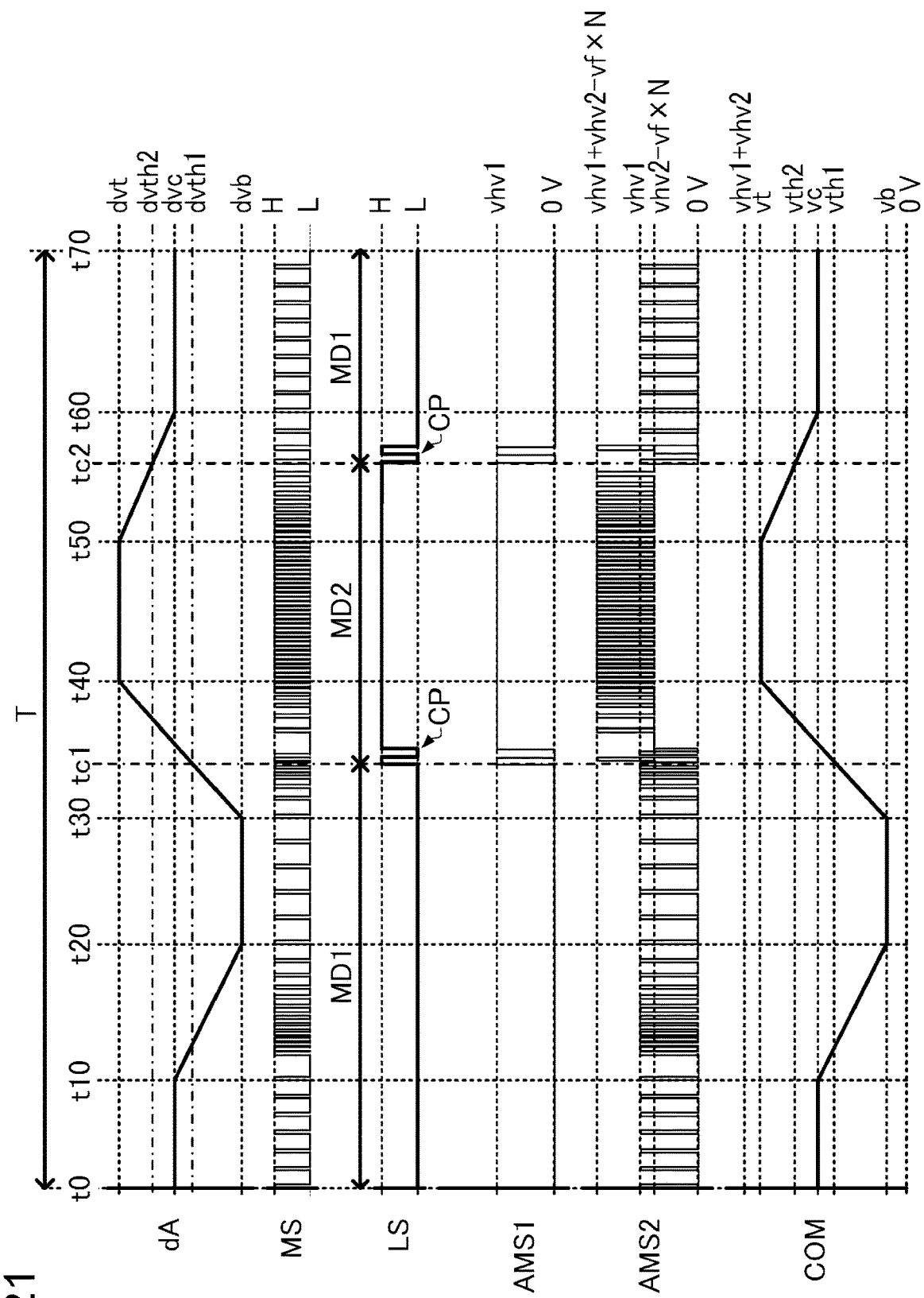
FIG. 21 is a diagram illustrating an example of various signal waveforms according to the fifth embodiment.

FIG. 21 illustrates an example of various signal waveforms of the drive circuit 50 according to the fifth embodiment. In the example of FIG. 21, the first amplified modulation signal AMS1 has a waveform obtained by amplifying the level switching signal LS. Since other signal waveforms in FIG. 21 are the same as those in FIG. 7, the description thereof will be omitted.

As described above, in the fifth embodiment, the transistors M3 and M4 are frequently repeatedly switched whenever the logic level of the modulation signal MS is switched. Accordingly, the transistors M3 and M4 have a larger switching loss than the energization loss. On the other hand, the transistors M1 and M2 are switched whenever the logic level of the level switching signal LS is switched, but the number of times the logic level of the level switching signal LS is switched is much smaller than the number of times the logic level of the modulation signal MS is switched. Accordingly, the transistors M1 and M2 have a larger energization loss than the switching loss.

Therefore, in the fifth embodiment, the on-resistance of the transistor M3 is larger than the on-resistance of the transistor M1 and the on-resistance of the transistor M2, and the on-resistance of the transistor M4 is larger than the on-resistance of the transistor M1 and the on-resistance of the transistor M2. For example, W/L of the transistors M3 and M4 is set to be smaller than W/L of the transistors M1 and M2, and thus, the on-resistance of the transistors M3 and M4 can be set to be larger than the on-resistance of the transistors M1 and M2. Conversely, the gate total charge amount Qg of the transistor M3 is smaller than the gate total charge amount Qg of the transistor M1 and the gate total charge amount Qg of the transistor M2, and the gate total charge amount Qg of the transistor M4 is smaller than the gate total charge amount Qg of the transistor M1 and the gate total charge amount Qg of the transistor M2. In addition, it is preferable that the transistors M3 and M4 are the same type of MOSFET and the transistors M1 and M2 are the same type of MOSFET. For example, in the example in FIG. 19 described above, when the transistors M3 and M4 are MOSFETn, the transistors M1 and M2 are MOSFE™. Here, n is any integer of 2 or more and 5 or less, and m is any integer smaller than n.

As described above, in the fifth embodiment, since the transistors M3 and M4 are MOSFETs having a large on-resistance and a small gate total charge amount Qg, the switching losses of the transistors M3 and M4 are reduced. Moreover, since the transistors M1 and M2 are MOSFETs having a small on-resistance and a large gate total charge amount Qg, the energization losses of the transistors M1 and M2 are reduced.

Since other configurations of the liquid ejecting apparatus 1 of the fifth embodiment are similar to the first embodiment to the fourth embodiment, the description thereof will be omitted.

According to the liquid ejecting apparatus 1 of the fifth embodiment described above, effects similar to the liquid ejecting apparatus 1 of the first embodiment to the third embodiment can be obtained.

Further, according to the liquid ejecting apparatus 1 of the fifth embodiment, in the drive circuit 50, since the transistors M3 and M4 having a high frequency of performing the switching operations are MOSFETs having a large on-resistance and a small gate total charge amount Qg, the switching losses of the transistors M3 and M4 are reduced. Moreover, since the transistors M1 and M2 having a low frequency of performing the switching operations are MOSFETs having a small on-resistance and a large gate total charge amount Qg, the energization losses of the transistors M1 and M2 are reduced.

6. Modification Example

The present disclosure is not limited to the present embodiment, and various modifications can be made within the scope of the spirit of the present disclosure.

For example, in each of the above embodiments, although the base drive signal dA is input from the controller 100 to the drive circuit 50, the controller 100 may receive, as an input, data of a difference value between two continuous digital values of the base drive signal dA, and the base drive signal dA may be restored by adding each value of the data.

Moreover, for example, in the fourth embodiment and the fifth embodiment, the first threshold dvth1 for switching the level switching signal LS from the L level to the H level and the second threshold dvth2 for switching the level switching signal LS from the H level to the L level may be the same value.

Moreover, in each of the above embodiments, the level switching signal generation circuit 710 switches the logic level of the level switching signal LS in accordance with the value of the base drive signal dA that is the digital signal, may switch the logic level of the level switching signal LS by comparing the value of the base drive signal aA that is the analog signal, that is, the potential of the base drive signal aA with the threshold. In this case, the thresholds of the base drive signal aA may be potentials of the base drive signal aA corresponding to the thresholds dvth1, dvth2, dvth3, dvth4, dvth5, and dvth6 of the base drive signal dA.

Although the embodiments have been described above, the present disclosure is not limited to these embodiments, and can be implemented in various aspects without departing from the gist thereof. For example, the above-described embodiments can also be appropriately combined with each other.

The present disclosure includes substantially the same configurations as the configurations described in the embodiments, for example, configurations having the same functions, methods, and results, or configurations having the same objects and effects. Moreover, the present disclosure includes configurations in which non-essential parts of the configuration described in the embodiments are replaced. Moreover, the present disclosure includes configurations that achieve the same operational effects or configurations that can achieve the same objects as those of the configurations described in the embodiment. Moreover, the present disclosure includes configurations in which a known technology is added to the configurations described in the embodiments.

The following contents are derived from the above-described embodiments.

An aspect of a drive circuit is a drive circuit that outputs a drive signal for driving a drive section. The drive circuit includes a modulation circuit that modulates a base drive signal that is a base of the drive signal, and outputs a modulation signal, an amplification circuit that outputs a first amplified modulation signal obtained by amplifying the modulation signal, a level switching signal generation circuit that generates a level switching signal that is a digital signal including a first potential and a second potential higher than the first potential, a level shift circuit that outputs the first amplified modulation signal as a second amplified modulation signal when the level switching signal has the first potential, and outputs, as the second amplified modulation signal, a signal obtained by shifting a potential of the first amplified modulation signal when the level switching signal has the second potential, a demodulation circuit that demodulates the second amplified modulation signal, and outputs the drive signal, and a storage that stores a first threshold and a second threshold different from the first threshold. The level switching signal generation circuit switches the level switching signal from the first potential to the second potential in a case where a value of the base drive signal increases and becomes larger than the first threshold when the level switching signal has the first potential, and switches the level switching signal from the second potential to the first potential in a case where the value of the base drive signal decreases and becomes smaller than the second threshold when the level switching signal has the second potential.

In the drive circuit, the drive signal changes in accordance with the change in the value of the base drive signal, but the drive signal changes with a delay with respect to the change in the base drive signal due to circuit delays of the modulation circuit, the amplification circuit, and the level shift circuit. In a case where the threshold for switching the level switching signal from the first potential to the second potential and the threshold for switching the level switching signal from the second potential to the first potential are the same, it may be difficult to set the thresholds such that, in consideration of the delay time duration of the drive signal, the level switching signal is switched from the first potential to the second potential in the period in which the voltage of the drive signal rises and the level switching signal is switched from the second potential to the first potential in the period in which the voltage of the drive signal decreases. On the other hand, in the drive circuit, the first threshold for switching the level switching signal from the first potential to the second potential and the second threshold for switching from the second potential to the first potential can be set independently of each other. Thus, in consideration of the delay time duration of the drive signal, it is easy to set the first threshold such that the level switching signal is switched from the first potential to the second potential in the period in which the voltage of the drive signal rises and set the second threshold such that the level switching signal is switched from the second potential to the first potential in the period in which the voltage of the drive signal decreases. Accordingly, according to the drive circuit, since a possibility that a timing at which the potential of the level switching signal is switched is deviated and the waveform of the drive signal is distorted is reduced, the waveform accuracy of the drive signal can be improved.

In an aspect of the drive circuit, the level switching signal generation circuit may switch the level switching signal from the first potential to the second potential, switch the level switching signal from the second potential to the first potential, and then switch the level switching signal from the first potential to the second potential.

In the drive circuit, the level switching signal generation circuit switches the level switching signal from the first potential to the second potential, and then outputs the counter pulse in order to reduce the waveform distortion of the drive signal caused by this switching. When the counter pulse is output in the period in which the voltage of the drive signal is constant, the waveform of the drive signal may be distorted by the counter pulse. On the other hand, according to the drive circuit, since it is easy to set the first threshold such that the counter pulse is output in the period in which the voltage of the drive signal rises, the waveform distortion of the drive signal is reduced, and the waveform accuracy of the drive signal can be improved.

In an aspect of the drive circuit, the level switching signal generation circuit may switch the level switching signal from the second potential to the first potential, switch the level switching signal from the first potential to the second potential, and then switch the level switching signal from the second potential to the first potential.

In the drive circuit, the level switching signal generation circuit switches the level switching signal from the second potential to the first potential, and then outputs the counter pulse in order to reduce the waveform distortion of the drive signal caused by this switching. When the counter pulse is output in the period in which the voltage of the drive signal is constant, the waveform of the drive signal may be distorted by the counter pulse. On the other hand, according to the drive circuit, since it is easy to set the second threshold such that the counter pulse is output in the period in which the voltage of the drive signal decreases, the waveform distortion of the drive signal is reduced, and the waveform accuracy of the drive signal can be improved.

An aspect of a liquid ejecting apparatus includes an ejecting section that ejects a liquid, and a drive circuit that outputs a drive signal for driving the ejecting section. The drive circuit includes a modulation circuit that modulates a base drive signal that is a base of the drive signal, and outputs a modulation signal, an amplification circuit that outputs a first amplified modulation signal obtained by amplifying the modulation signal, a level switching signal generation circuit that generates a level switching signal that is a digital signal including a first potential and a second potential higher than the first potential, a level shift circuit that outputs the first amplified modulation signal as a second amplified modulation signal when the level switching signal has the first potential, and outputs, as the second amplified modulation signal, a signal obtained by shifting a potential of the first amplified modulation signal when the level switching signal has the second potential, a demodulation circuit that demodulates the second amplified modulation signal, and outputs the drive signal, and a storage that stores a first threshold and a second threshold different from the first threshold, and the level switching signal generation circuit switches the level switching signal from the first potential to the second potential in a case where a value of the base drive signal increases and becomes larger than the first threshold when the level switching signal has the first potential, and switches the level switching signal from the second potential to the first potential in a case where the value of the base drive signal decreases and becomes smaller than the second threshold when the level switching signal has the second potential.

In this liquid ejecting apparatus, in the drive circuit, the first threshold for switching the level switching signal from the first potential to the second potential and the second threshold for switching from the second potential to the first potential can be set independently of each other. Thus, in consideration of the delay time duration of the drive signal, it is easy to set the first threshold such that the level switching signal is switched from the first potential to the second potential in the period in which the voltage of the drive signal rises and set the second threshold such that the level switching signal is switched from the second potential to the first potential in the period in which the voltage of the drive signal decreases. Accordingly, according to the liquid ejecting apparatus, in the drive circuit, since a possibility that a timing at which the potential of the level switching signal is switched is deviated and the waveform of the drive signal is distorted is reduced, the waveform accuracy of the drive signal can be improved.

In an aspect of the liquid ejecting apparatus, the level switching signal generation circuit may switch the level switching signal from the first potential to the second potential, switch the level switching signal from the second potential to the first potential, and then switch the level switching signal from the first potential to the second potential.

In an aspect of the liquid ejecting apparatus, the level switching signal generation circuit may switch the level switching signal from the second potential to the first potential, switch the level switching signal from the first potential to the second potential, and then switch the level switching signal from the second potential to the first potential.

What is claimed is:

1. A drive circuit that outputs a drive signal for driving a drive section, the drive circuit comprising:
   a modulation circuit that modulates a base drive signal that is a base of the drive signal, and outputs a modulation signal;
   an amplification circuit that outputs a first amplified modulation signal obtained by amplifying the modulation signal;
   a level switching signal generation circuit that generates a level switching signal that is a digital signal including a first potential and a second potential higher than the first potential;
   a level shift circuit that outputs the first amplified modulation signal as a second amplified modulation signal when the level switching signal has the first potential, and outputs, as the second amplified modulation signal, a signal obtained by shifting a potential of the first amplified modulation signal when the level switching signal has the second potential;
   a demodulation circuit that demodulates the second amplified modulation signal, and outputs the drive signal; and
   a storage that stores a first threshold and a second threshold different from the first threshold, wherein
   the level switching signal generation circuit switches the level switching signal from the first potential to the second potential in a case where a value of the base drive signal increases and becomes larger than the first threshold when the level switching signal has the first potential, and switches the level switching signal from the second potential to the first potential in a case where the value of the base drive signal decreases and becomes smaller than the second threshold when the level switching signal has the second potential.

2. The drive circuit according to claim 1, wherein
   the level switching signal generation circuit switches the level switching signal from the first potential to the second potential, switches the level switching signal from the second potential to the first potential, and then switches the level switching signal from the first potential to the second potential.

3. The drive circuit according to claim 1, wherein
   the level switching signal generation circuit switches the level switching signal from the second potential to the first potential, switches the level switching signal from the first potential to the second potential, and then switches the level switching signal from the second potential to the first potential.

4. A liquid ejecting apparatus comprising:
   an ejecting section that ejects a liquid; and
   a drive circuit that outputs a drive signal for driving the ejecting section, wherein
   the drive circuit includes
   a modulation circuit that modulates a base drive signal that is a base of the drive signal, and outputs a modulation signal,
   an amplification circuit that outputs a first amplified modulation signal obtained by amplifying the modulation signal,
   a level switching signal generation circuit that generates a level switching signal that is a digital signal including a first potential and a second potential higher than the first potential,
   a level shift circuit that outputs the first amplified modulation signal as a second amplified modulation signal when the level switching signal has the first potential, and outputs, as the second amplified modulation signal, a signal obtained by shifting a potential of the first amplified modulation signal when the level switching signal has the second potential,
   a demodulation circuit that demodulates the second amplified modulation signal, and outputs the drive signal, and
   a storage that stores a first threshold and a second threshold different from the first threshold, and
   the level switching signal generation circuit switches the level switching signal from the first potential to the second potential in a case where a value of the base drive signal increases and becomes larger than the first threshold when the level switching signal has the first potential, and switches the level switching signal from the second potential to the first potential in a case where the value of the base drive signal decreases and becomes smaller than the second threshold when the level switching signal has the second potential.

5. The liquid ejecting apparatus according to claim 4, wherein the level switching signal generation circuit switches the level switching signal from the first potential to the second potential, switches the level switching signal from the second potential to the first potential, and then switches the level switching signal from the first potential to the second potential.

6. The liquid ejecting apparatus according to claim 4, wherein the level switching signal generation circuit switches the level switching signal from the second potential to the first potential, switches the level switching signal from the first potential to the second potential, and then switches the level switching signal from the second potential to the first potential.

\* \* \* \* \*